United States Patent
Booij et al.

(10) Patent No.: US 10,705,106 B2
(45) Date of Patent: Jul. 7, 2020

(54) SYSTEM AND METHOD FOR MONITORING A STATE OF A FLUID IN AN INDOOR SPACE AS WELL AS A CLIMATE CONTROL SYSTEM

(71) Applicant: Nederlandse Organisatie voor toegepast-natuurwetenschappelijk onderzoek TNO, 's-Gravenhage (NL)

(72) Inventors: Paul Sebastian Booij, 's-Gravenhage (NL); Jeroen Edwin Fransman, 's-Gravenhage (NL); Joris Sijs, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 138 days.

(21) Appl. No.: 15/306,624

(22) PCT Filed: Apr. 28, 2015

(86) PCT No.: PCT/NL2015/050286
§ 371 (c)(1),
(2) Date: Oct. 25, 2016

(87) PCT Pub. No.: WO2015/167329
PCT Pub. Date: Nov. 5, 2015

(65) Prior Publication Data
US 2017/0045548 A1   Feb. 16, 2017

(30) Foreign Application Priority Data

Apr. 28, 2014 (EP) .................................... 14166215

(51) Int. Cl.
*G01P 5/00*   (2006.01)
*G01K 7/42*   (2006.01)
(Continued)

(52) U.S. Cl.
CPC .............. *G01P 5/001* (2013.01); *G01K 7/427* (2013.01); *G01P 5/10* (2013.01); *H05K 7/20836* (2013.01)

(58) Field of Classification Search
CPC .... G01K 7/427; G01K 2213/00; G01P 5/001; G01P 5/10; H05K 7/20836
See application file for complete search history.

(56) References Cited

U.S. PATENT DOCUMENTS 8,180,494 B2 * 5/2012 Dawson ................. G05B 15/02
700/276
8,744,818 B2 * 6/2014 Ueda ................... G06F 17/5004
374/134

(Continued)

FOREIGN PATENT DOCUMENTS

WO   2007/107341 A1   9/2007

OTHER PUBLICATIONS

P S Booij et al: "Localized climate control in greenhouses", Nonlinear Model Predictive Control, Aug. 23, 2012 (Aug. 23, 2012), pp. 454-459, XP055144601, Retrieved from the Internet: URL:http://www.tue.nl/en/publication/ep/p/d/ep-uid/272127/[retrieved on Oct. 6, 2014] the whole document.

(Continued)

Primary Examiner — Jill E Culler
Assistant Examiner — Leo T Hinze
(74) Attorney, Agent, or Firm — Banner & Witcoff, Ltd.

(57) ABSTRACT

A monitoring system for monitoring a state of a fluid in an indoor space including a state of a flow field for said fluid is presented. The system includes an input unit (81), a simulation unit (82), a comparison unit (83) and a state correction unit (84). The input unit (81) comprises a plurality of temperature sensors (81*a*, 81*b*, . . . , 81*m*T) to obtain temperature measurement data indicative for a temperature (Continued)

field in said indoor space. The simulation unit (82) is provided to simulate the fluid in said indoor space according to an indoor climate model to predict a state of the fluid including at least a temperature field and a flow field for the fluid in said indoor space, and has an output to provide a signal indicative for the flow field. The comparison unit (83) is provided to compare the predicted temperature field with the temperature measurement data, and the state correction unit (84) is provided to correct the predicted state of the fluid based on a comparison result of said comparison unit (83). The monitoring system may be part of a climate control system.

19 Claims, 17 Drawing Sheets

(51) Int. Cl.
*G01P 5/10* (2006.01)
*H05K 7/20* (2006.01)

(56) References Cited

U.S. PATENT DOCUMENTS

2011/0060571 A1   3/2011   Ueda et al.
2013/0006426 A1   1/2013   Healey et al.

OTHER PUBLICATIONS

Yanzheng Liu et al: "Temperature Simulation of Greenhouse with CFD Methodsand Optimal Sensor Placement 1", Sensors & Transducers, Mar. 14, 2014 (Mar. 14, 2014), pp. 40-44, XP055144472, Retrieved from the Internet: URL:http://www.sensorsportal.com/HTML/DIGEST/march_2014/Special_issue/P_SI-538.pdf [retrieved on Oct. 6, 2014] the whole document.

Yun Zhao et al: "A Simulation and experiment study on temperature of a forced ventilated greenhouse", Proceedings of SPIE, vol. 8762, Mar. 19, 2013 (Mar. 19, 2013), p. 87620p, xp055144608, ISSN: 0277-786X, DOI: 10.1117/12.2019745 abstract.

Gillijns, S. et al, "What is the Ensemble Kalman Filter and How Well Does it Work?", Procceedings of the 2006 American Control Conference, Minneapolis, Minnestoa, USA, Jun. 14-16, 2006.

Chandrasekar, J. et al, "A Comparison of the Extended and Unscented Kalman Filters for Discrete-Time Systems with Nondifferentiable Dynamics" Proceedings of the 2007 American Control Conference, Marriot Marquis Hotel at Times Square, New Your City, USA, Jul. 11-13, 2007.

Suzuki, Takao, et al, "Reduced-order Kalman-filtered hybrid simulation combining particle tracking velocimetry and direct numerical simulation" J. Fuild Mech. (2012), vol. 709, pp. 249-288. Cambridge University Press 2012. doi: 10.1017/jfm.2012.334.

Jul. 16, 2015—International Search Report and Written Opinion of PCT/NL2015/050286.

Kalman, R.E., "A New Approach to Linear Filtering and Prediction Problems" Transactions of the ASME—Journal of Basic Engineering, 82 (Series D); 35-45. 1960 Research Institute for Advanced Study.

Temam, et al., "On Some Control Problems in Fluid Mechanics" Theoretical and Computational Fluid Dynamics, Springer-Verlag 1990 1:303-325.

\* cited by examiner

For u and similar for v and w     FIG. 10

SYSTEM AND METHOD FOR MONITORING A STATE OF A FLUID IN AN INDOOR SPACE AS WELL AS A CLIMATE CONTROL SYSTEM

CROSS-REFERENCE TO RELATED APPLICATIONS

This application is a U.S. National Stage application under 35 U.S.C. §371 of International Application PCT/NL2015/050286 (published as WO 2015/167329 A1), filed Apr. 28, 2015, which claims the benefit of priority to EP 14166215.5. filed Apr. 28, 2014. Benefit of the filing date of each of these prior applications is hereby claimed. Each of these prior applications is hereby incorporated by reference in its entirety.

BACKGROUND OF THE INVENTION

Field of the Invention

The present invention relates to a monitoring system for monitoring a state of a fluid in an indoor space.

The present invention further relates to a method for monitoring a state of a fluid in an indoor space.

The present invention further relates to a climate control system including the monitoring system.

The present invention further relates to a climate control method including the monitoring method.

Related Art

In particular in indoor climate control systems it is desired to determine the actual state of the indoor climate, i.e. the state of a fluid, in an indoor space, such as a greenhouse. The state of the fluid may comprise a temperature field of the fluid, a flow field of the fluid, and a humidity field. In particular measurement of the flow field is complicated.

According to a known approaches a smoke source is placed in the indoor space and it is optically determined how the smoke moves through the indoor space.

According to another approach air currents are monitored by particle image velocimetry (PIV). This method is similar to the smoke tests, but allows for a quantitative measurement by the use of tracer particles and cameras.

Also methods are known to measure air flow at particular positions. However, as air velocities in an indoor space typically are low, only two principles are appropriate to achieve this.

One of these is hot-wire anemometry. According to this method a wire or bead is held at a constant temperature. The amount of energy that is required to keep the wire/bead on temperature provides information about the air flow. The magnitude of the air flow at a point can thus be determined. In order to also provide information about the direction a combination of wires may be used. Alternatively structures may be applied that are selectively sensitive for air currents in a particular direction.

Another one is ultrasonic anemometry. Therein ultrasonic transducers couples are used which measure a delay between the transmitter and receiver. The delay is indicative for the temperature and air flow in that direction. Three mutually perpendicularly arranged couples allow for an accurate three-dimensional flow measurement and the average temperature between the transducers. A similar method is based on Laser Doppler anemometry.

From the data so obtained the entire flow field can be reconstructed in an additional step, such as interpolation, acoustic tomography and filtering methods that are adapted for use in non-linear systems, such as ensemble Kalman filters, unscented Kalman filters and particle filters.

The known methods have the disadvantage that the sensors that are used to gather the raw data are expensive, and therewith inattractive for use, in particular in large indoor spaces.

It is noted that US2011/0060571 discloses a thermal-fluid-simulation analyzing apparatus including (a) an execution unit that generates an analysis model using analysis conditions to conduct a first thermal fluid simulation analysis based on the generated analysis model, (b) an analysis-condition collecting unit that collects analysis conditions when a predetermined period passes after the first thermal fluid simulation analysis, (c) a condition extracting unit that extracts a boundary condition from the analysis conditions collected by the analysis-condition collecting unit, and (d) a re-execution unit that selects a region corresponding to the boundary condition extracted by the condition extracting unit from regions of the analysis model generated by the execution unit, updates the selected region with the boundary condition, and conducts a second thermal fluid simulation analysis for the updated analysis model.

The known thermal-fluid-simulation analyzing apparatus is used for climate control in data centers that have a specific hot/cold aisle setup, and cooling through a plenum with perforated tiles. This is an idealized situation in that the general shape of the flow pattern is well known. Generally, in indoor climate control, e.g. in greenhouses, this is not the case and more complicated simulation models are necessary. This also implies that the results obtained indirectly from the measurements are more susceptible for noise.

SUMMARY OF THE INVENTION

It is an object of the invention to provide a method and a system that render it possible to use cheaper sensors.

According to a first aspect of the invention a monitoring system is provided for monitoring a state of a fluid in an indoor space including a state of a flow field for said fluid. The monitoring system includes an input unit, a simulation unit, a comparison unit and a state correction unit.

The input unit comprises a plurality of temperature sensors to obtain temperature measurement data indicative for a temperature field in the indoor space.

The simulation unit simulates the fluid in said indoor space according to an indoor climate model to predict a state of the fluid.

A theoretical framework modeling the behavior of the variables of interest is discussed for example in Suhas V. Patankar, "Numerical Heat Transfer and Fluid Flow", ISBN 0-07-1980 048740-S on page 15. As set out therein, the following general differential equation applies to each variable:

$$\frac{\partial}{\partial t}(\rho\phi) + div(\rho u\phi) = div(\Gamma \ grad \ \phi) + S$$

Therein $\Gamma$ is the diffusion coefficient and S is the source term. The quantities $\Gamma$ and S are specific to a particular meaning of $\phi$. The four terms in the general differential equation are the unsteady term, the convection term, the diffusion term, and the source term. The dependent variable $\phi$ can stand for a variety of different quantities, such as the mass fraction of a chemical species, the enthalpy or the temperature, a velocity component, the turbulence kinetic energy, or a turbulence length scale. Accordingly, for each of these variables, an appropriate meaning will have to be given to the diffusion coefficient and the source term S. For example, in case the dependent variable $\phi$ is a temperature field, then the source term is a thermal source term, like power added through the floor heating and heating and power extracted by air conditioning.

The predicted state includes at least a temperature field and a flow field for the fluid in the indoor space. The simulation unit has an output to provide a signal indicative for the flow field. The simulation unit comprises a state estimation unit, a matrix update module and a Kalman prediction module. The simulation unit is provided to execute an iteration (u,v,w,P) in an estimation of at least a flow field and a pressure field based at least on a previous known state of the fluid ($u^{k-1}, v^{k-1}, w^{k-1}, P^{k-1}, T^{k-1}$) in accordance with the indoor climate model. The matrix update module is provided to update a first and a second state evolution matrix (ASS,BSS) using a model for the temperature field defined by $A_T(u,v,w)T = B_e e_T^{k-1} + B_q q_T^{k-1} + B_0 T^{k-1}$. The Kalman prediction module is provided to estimate a temperature field (Tp) using said first and second state evolution matrix.

The comparison unit compares the predicted temperature field with the temperature measurement data, and the state correction unit corrects the predicted state of the fluid based on a comparison result of the comparison unit.

According to a second aspect of the invention a method is provided for monitoring a state of a fluid in an indoor space, including a state of a flow field for said fluid. The method comprises the following steps:
obtaining temperature measurement data indicative for a temperature field in said indoor space;
simulating the fluid in said indoor space according to an indoor climate model to predict a state of said fluid including at least a temperature field and a flow field for the fluid in said indoor space.
while calculating a corrected state of said indoor space on the basis of a comparison of the predicted temperature field and the temperature measurement data.
Simulating the fluid, referred to above, comprises:
executing an iteration (u,v,w,P) in an estimation of at least a flow field and a pressure field based at least on a previous known state of the fluid ($u^{k-1}, v^{k-1}, w^{k-1}, P^{k-1}, T^{k-1}$), according to the indoor climate model;
updating a first and a second state evolution matrix ($A_{SS}$, $B_{SS}$) using a model for the temperature field defined by $A_T(u,v,w)T = B_e e_T^{k-1} + B_q q_T^{k-1} + B_0 T^{k-1}$; and
applying a Kalman prediction step to estimate a temperature field (Tp) using said first and second state evolution matrix.

The system according to the first aspect and the method according to the second aspect obviate the use of dedicated flow meters. The present invention instead reconstructs the flow field from measurements of a temperature field in the indoor space using a Kalman based approach. Temperature sensors can be provided at a relatively low cost. This renders it possible to obtain a relatively detailed and accurate assessment of the flow field. The Kalman based approach enables doing this without introducing a substantial amount of noise. As the Kalman filter is part of the iterative simulation process this renders it possible that the typically non-linear equations involved can be accurately approximated by discretized linear versions. This avoids complex and computational intensive calculations.

In this connection it is noted that Computational Fluid Dynamic (CFD) methods are known to simulate the indoor climate given boundary conditions as outside temperature, sun, floor and wall temperatures and source terms such as heaters and air conditioning devices. These methods typically apply a Finite Volume Method (FVM)) wherein the indoor space is discretized into cells, each of which has its own temperature, 3D flow velocity and pressure. For example, in the implementation known as "SIMPLE" (Semi-Implicit Method for Pressure Linked Equations) the following sets of equations for energy, momentum and pressure correction are used. The "SIMPLE" method is described in more detail in Patankar, referred to above, on pp. 126-. The equations include the following discretized Navier-Stokes equations with an additional energy equation.

Energy:

$$A_T(u,v,w)T = b_T(T^k, q_T^k, e_T^k) \quad (1)$$

Momentum $$A_u(u,v,w,P)\hat{u} = b_u(u^k, q_u^k, e_u^k) \quad (2a)$$

$$A_v(u,v,w,P)\hat{v} = b_v(v^k, q_v^k, e_v^k) \quad (2b)$$

$$A_w(u,v,w,P)\hat{w} = b_w(T, w^k, q_w^k, e_w^k) \quad (2c)$$

Pressure correction $$A_P(\hat{u},\hat{v},\hat{w},P)P' = b_P(\hat{u},\hat{v},\hat{w}) \quad (3)$$

Therein the vectors T, u, v, w, P contain the temperature field, the air velocity in x, y, and z directions and pressure field respectively, for time step k+1. The results obtained for k+1 may be one of a series of results being followed by the results for k+2, k+3 etc. Alternatively the results for k+1 may be considered as a steady state solution. In the sequel of this description the symbol $\Phi$ will also be used to denote a field in general and this symbol may be provided with an index referring to a specific type of field. For example $\phi_T^k$ indicates a temperature field at time step k (which is assumed known as it results from the previous monitoring step).

The vectors $\hat{u}, \hat{v}, \hat{w}$ are uncorrected velocity vectors, i.e. velocity vectors that jointly do not meet the law of conservation of mass.

The vector P' is a pressure correction field. This field serves to correct $\hat{u}, \hat{v}, \hat{w}$ into fields u,v,w that do adhere to mass conservation.

The source terms are denoted by the character "q". E.g. $q_T$ is a vector of thermal source terms, like power added through heating and power extracted by airconditioning. Exogenous inputs or boundary conditions are indicated by the symbol "e", e.g. the outside weather conditions, an opened or closed state of windows etc.

Each matrix A is of size N×N, with N the amount of cells in the grid. In practice, the amount of cells may range from thousands to millions. Accordingly, these matrices can become very large. They are largely sparse, but their structure can be time dependent. E.g. in the energy equation, not only the entries of $A_T$ change as air flow changes, but also their location. I.e. the temperature of a certain cell might depend on the temperature of its left neighbor if u is positive there, but it will depend on the temperature of its right neighbor if the flow changes direction.

The SIMPLE method solves these 5 sets jointly. This is an iterative method involving the following sequence of steps that is repeated until convergence of this set of equations occurs.

Step 1: solve u* from $$A_u(u,v,w,P)u^* = b_u(u^{k-1}, q_u^{k-1}, e_u^{k-1}) \quad (2a)$$

Step 2: update û with $$\hat{u} = (1-\alpha)u + \alpha u^* \quad (2aa)$$

Step 3: solve v* from $$A_v(u,v,w,P)v^* = b_v(v^{k-1}, q_v^{k-1}, e_v^{k-1}) \quad (2b)$$

Step 4: update v̂ with $$\hat{v} = (1-\alpha)v + \alpha v^* \quad (2ba)$$

Step 5: solve w* from $$A_w(u,v,w,P)w^* = b_w(w^{k-1}, q_w^{k-1}, e_w^{k-1}, T) \quad (2c)$$

Step 6: update ŵ with $$\hat{w} = (1-\alpha)w + \alpha w^* \quad (2ca)$$

Step 7: solve P' from $$A_P(\hat{u},\hat{v},\hat{w},P)P' = b_P(\hat{u},\hat{v},\hat{w}) \quad (3)$$

Step 8: update P with:

$$P = P + \alpha_p P' \quad (3a)$$

Step 9: update u,v,w with the correction $$(u,v,w) = f((\hat{u},\hat{v},\hat{w}), P') \quad (4)$$

Step 10: solve T* from $$A_T(u,v,w,)T^* = b_T(T^k, q_T^k, e_w^k) \quad (1)$$

Step 11: Update T with $$T = (1-\alpha)T + \alpha T^*$$

In the equations above, the variables $x^{k-1}$ are the variables for which values are determined for point in time k−1. The remaining variables are part of the iteration procedure for computation of the result for k. As becomes apparent from the above, the joint set of equations can be solved in a sequential manner. Alternatively one or more equations may be solved in a parallel manner.

The state estimation unit is arranged to execute an iteration in an estimation of at least a flow field and a pressure field based at least on a previous known state of the fluid, according to the indoor climate model.

The matrix update module is arranged to update a first and a second state evolution matrix $A_{SS}$, $B_{SS}$. These matrices are used to predict a current state at point in time k from a previous state at point in time k−1 according to:

$$T_P = A_{SS} T^{k-1} + B_{SS}(q_T^{k-1} e_T^{k-1})$$

The matrix update module therewith uses a model for the temperature field defined by $$A_T(u,v,w)T = B_e e_T^{k-1} + B_q q_T^{k-1} + B_0 T^{k-1}.$$

Therein u,v,w and T respectively indicate the current values of the iterants for the states of the flow field and the temperature field that are to be estimated for the current point in time k, which are indicated respectively by $u^k, v^k, w^k, T^k$.

The terms $e_T^{k-1}$ and $q_T^{k-1}$ respectively are the boundary conditions and the source terms for the temperature field valid between the previous point in time k−1 and the current point in time k. The thermal source term may represent, power added through heating and/or power extraction, e.g. by airconditioning. The thermal boundary conditions represent exogenous inputs such as outside temperature.

A model for the temperature field as presented above, is for example described in more detail in Patankar, referred to above on pp. 126-131.

The matrix $A_T$ is calculated as a function of current values of the iterants for the states of the flow field.

The Kalman prediction module is arranged to estimate a temperature field using the first and second state evolution matrix $A_{SS}$, $B_{SS}$ referred to above.

The comparison unit comprises a Kalman evaluation module to update the predicted temperature field to an updated temperature field by comparing the temperature measurement data with the predicted temperature field.

The state correction unit comprises a temperature iteration module for generating an iterated value for a temperature field based on said comparison result.

A data processor is provided to verify if a difference between the temperature field as indicated by the temperature measurement data and the temperature field predicted by the Kalman prediction module complies with a predetermined requirement. The data processor is further provided to cause said simulation unit to perform a next iteration until said difference complies with the predetermined requirement and to update the estimated state of the fluid according to an iterated value for said state if said difference complies with the predetermined requirement. In this embodiment a Kalman filter, comprising a Kalman prediction module and a Kalman evaluation module is included to cooperate with the state estimation unit in an iterative mode. Therein the state estimation unit in particular provides iterated values u,v,w for the flow field to be estimated in the next state and these iterated values are used by the Kalman filter to predict a temperature field and subsequently evaluate the temperature field using the measured temperature data. Using the updated temperature field obtained with the Kalman filter a next iteration in the process of calculating the temperature field for point in time k is obtained, which is used by the state estimation unit to provide a next iteration for the flow field. Accordingly the iterative process simulates the fluid, e.g. air, in the indoor space, while also calculating an estimation for the state of the fluid at the point in time k. As the Kalman filter is part of this iterative process, the typically non-linear equations involved can be accurately approximated by discretized linear versions. This avoids complex and computational intensive calculations.

In an embodiment the state estimation unit of the monitoring system comprises a flow estimation unit, a pressure data processing module and a correction module.

The flow estimation unit provides an uncorrected estimation (û,v̂,ŵ) of a flow (u,v,w) in respective orthogonal directions (x,y,z) in by solving u*,v*, w* from $$A_u(u,v,w,P)u^* = b_u(u^{k-1}, q_u^{k-1}, e_u^{k-1})$$

$$A_v(u,v,w,P)v^* = b_v(v^{k-1}, q_v^{k-1}, e_v^{k-1})$$

$$A_w(u,v,w,P)w^* = b_w(T^{k-1}, w^{k-1}, q_w^{k-1}, e_w^{k-1})$$

Patankar, referred to above describes these equation for u,v, and w in more detail.

The state of the flow field and the temperature field of the fluid estimated for the previous point in time k−1 is indicated herein by $u^{k-1}, v^{k-1}, w^{k-1}, T^{k-1}$. The values u,v,w,P indicate the current iterands of the flow field and the pressure field. The terms $q_u^{k-1}, q_v^{k-1}, q_w^{k-1}$ indicates the source terms for the components u,v,w of the flow field valid between time k−1 and time k. It is noted that these terms are equal to 0 if no sources are provided to control the flow field. The same applies to the source term $q_T^{k-1}$ if there is no source to control the temperature field. The terms $e_u^{k-1}, e_v^{k-1}, e_w^{k-1}$ indicate the boundary conditions for the components u,v,w of the flow field, between time k−1 and time k.

Hence the values u*,v*, w* are estimations of the components of the flow field based on the established state for point in time k−1, the presently pending iterated values for the components of the flow field and the pressure field and the boundary conditions and the source terms for the flow field.

The flow estimation unit calculates weighted sums of the presently pending iterated values u,v,w and the estimations û,v̂,ŵ according to.

$$\hat{u}=(1-\alpha)u+\alpha u^*$$

$$\hat{v}=(1-\alpha)v+\alpha v^*$$

$$\hat{w}=(1-\alpha)w+\alpha w^*,$$

Therein $\alpha$ is a weighting factor in a range between 0 and 1. Preferably the value for $\alpha$ is in a range between 0.1 and 0.6. A value for a that is substantially higher than 0.6, e.g. 0.8 may result in instabilities, whereas a value for a that is substantially lower than 0.1, e.g. 0.05 would unnecessarily slow down the iterative process and therewith involve an unnecessary amount of computations.

The pressure data processing module calculates a pressure correction P' according to $$A_p(\hat{u},\hat{v},\hat{w})P'=b_p(\hat{u},\hat{v},\hat{w})$$

and to updates the pressure field P based on the pressure correction P' according to $$P=P+\alpha_p P'$$

Therein $\alpha_p$ is a weighting factor in a range between 0 and 1. Preferably the value for $\alpha_p$ is in a range between 0.2 and 0.4. A value for $\alpha_p$ that is substantially higher than 0.4, e.g. 0.6 may result in instabilities, whereas a value for $\alpha_p$ that is substantially lower than 0.2, e.g. 0.05 would unnecessarily slow down the iterative process and therewith involve an unnecessary amount of computations.

The correction module using the pressure correction P' to update the flow field (u,v,w) according to:

$$(u,v,w)=f((\hat{u},\hat{v},\hat{w}),P')$$

The required calculations presented above for the pressure correction and the correction of the flow field may for example be implemented as described by Patankar, referred to above.

The Kalman prediction module uses the first and the second state evolution matrix $A_{SS}$, $B_{SS}$ to estimate the predicted temperature field according to:

$$T_p = A_{SS}T^{k-1} + B_{SS}(q_T^{k-1}e_T^{k-1})$$

$$V_p = A_{SS}V_a^{k-1}A_{SS}^T + E_Q$$

$E_Q$ is the covariance matrix of the noise in the temperature field T from k−1 until k and $V_p$ is the forecast state error covariance matrix. Furthermore $V_a^{k-1}$ is the analysis state error covariance matrix for point in time k−1.

The Kalman evaluation module updates the predicted temperature field $T_p$ to the updated temperature field T* by comparing the temperature measurement data $y_T^k$ with respective predicted values $C_{SS}T_p$ based on said predicted temperature field Tp according to the following set of equations $$K = V_p C_{SS}^T (C_{SS} V_p C_{SS}^T + E_R)^{-1}$$

$$T^* = T_p + K(y_T^k - C_{SS}T_p)$$

Therein $E_R$ is the measurement error covariance matrix (at time k). The matrix $C_{SS}$ specifies the mapping from the predicted temperature field Tp as defined in the finite volume module to a subspace of said finite volume module for which temperature measurement data is available. In the case that measurement data is available for every cell defined by the finite volume model, the matrix $C_{SS}$ is simply the unity matrix.

As specified above, the temperature iteration module of the state correction unit generates an iterated value for the temperature field based on said comparison result.

As also specified above, the above calculations of the flow field, the evolution matrices, the predicted temperature field, the updated temperature field and the iterated value for the temperature field are repeated until the difference between subsequent iterants for the predicted temperature field complies with the predetermined requirement. Upon compliance the estimated state of the fluid is updated from state $u^{k-1}$, $v^{k-1},w^{k-1},T^{k-1},P^{k-1}$ to the next state $u^k,v^k,w^k,T^k,P^k$ according to the iterated value u,v,w,T,P for the state. In addition the analysis state error covariance matrix may be computed as $V_a^k = (I - K\, C_{SS})V_p$.

Subsequently a new series of iterations may start to compute the state for point in time k+1.

The monitoring system according to the first aspect of the present invention may be part of a climate control system according to a third aspect of the invention.

The monitoring method according to the second aspect of the present invention may be part of a climate control method according to a fourth aspect of the invention.

In a preferred embodiment of the climate control system and method, a set of coupled optimization problems of the following form is jointly solved:

$$z_\Phi^k = \arg\min_{z_\Phi}([S_\Phi^{k+1}O]z_\Phi - \tilde{\Phi}^{k+1})^T Q_\Phi^k ([S_\Phi^{k+1}O]z_\Phi - \tilde{\Phi}^{k+1}) + ([OI]z_\Phi)^T R_\Phi^k ([OI]z_\Phi) \quad (5a)$$

Subject to $$[A_\Phi^k - B_\Phi^k]z_\Phi - b'_\Phi^k(\Phi^k, e_\Phi^k) = 0 \quad (5b)$$

Therein $$b'_\Phi^k(\Phi^k, e_\Phi^k) = B_e e_\Phi^k + B_{0,\Phi}\Phi^k \quad (5b)$$

and, $$z_\Phi^k = \begin{bmatrix} \Phi^{k+1} \\ q_\Phi^k \end{bmatrix}$$

is the optimum value found for the augmented state vector $$z_\Phi = \begin{bmatrix} \Phi \\ q_\Phi \end{bmatrix}$$

in the coupled set of equations starting from the data established at point in time k. The augmented state vector comprises an estimated optimum field vector $\Phi^{k+1}$ for the field $\Phi$ at point in time k+1 that is expected to be achieved with an estimated optimum source term $q_\Phi^k$ for the source $q_\Phi$ to be optimized respectively. The term $e_\Phi^k$ represents boundary conditions relevant for said climate related variable at point in time k. The augmented state vector only has a modestly increased dimension as compared to the original state vector for the field Φ, as the number of source terms typically is substantially smaller than the number of cells of the space. For example for a space portioned in thousands we may for example have in the order of a few or a few tens of source terms. If the space is partitioned in millions the number of source terms is for example in the order of a few tens. Vector $\tilde{\Phi}^k$ specifies setpoints for said climate related variable at point in time k for at least a part of said plurality of cells. Further $S_\Phi$ is an nxn selection matrix, wherein n is the length of vector Φ, selecting cells for said distribution having a setpoint, O is the zero matrix, I is the identity matrix and $Q_\Phi^k$ and $R_\Phi^k$ are weighting matrices for tracking and energy consumption. Furthermore therein $A_\Phi$ is a matrix that defines the development of vector Φ as a function of one or more other vectors of climate related variables. The matrix $B_\Phi^k$ maps the source terms $q_\Phi$ for field Φ to the field values directly affected by those source terms. The resolution of the linearly constrained quadratic optimization problem according to the present invention results in a solution $z_\Phi^*$ that includes both the values for source terms $q_\Phi$ and the values of the controlled climate vector Φ that are expected to be achieved with those values of the source terms. Upon completion of the iterative process a next value $$\hat{z}_\Phi^k = \begin{bmatrix} \Phi^{k+1} \\ q_\Phi^k \end{bmatrix}$$

is established. A set of actuators may then be controlled at point in time k in accordance with the values for source terms $q_\Phi^k$ found, which is expected to result in the field $\Phi^{k+1}$ at the subsequent point in time k+1. As the values for the source terms are obtained as a solution of a linearly constrained quadratic problem, it is guaranteed that the found solution is indeed the globally optimal solution that could be reached. The results obtained for k may be one of a series of results being followed by the results for k+1, k+2 etc. Alternatively the results for k+1 may be considered as a steady state solution.

BRIEF DESCRIPTION OF THE DRAWINGS

These and other aspects are described in more detail with reference to the drawing. Therein.

DETAILED DESCRIPTION OF EMBODIMENTS

Like reference symbols in the various drawings indicate like elements unless otherwise indicated.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

Figure 1:
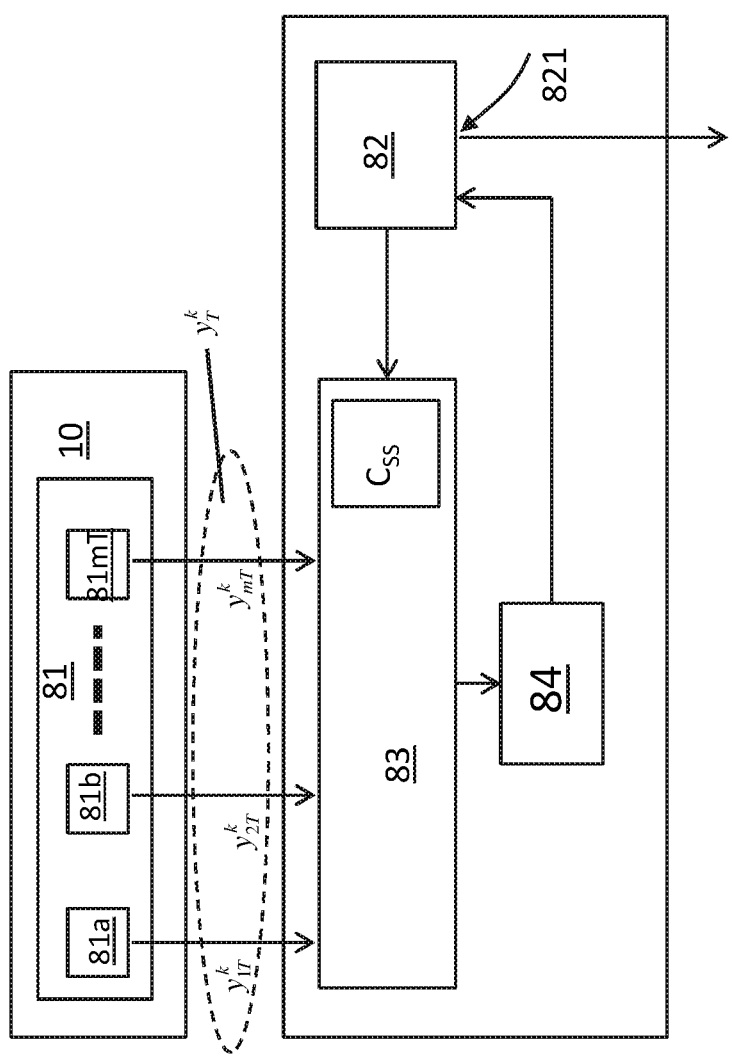
FIG. 1 schematically shows an embodiment of a monitoring system according to the first aspect of the present invention.

FIG. 1 schematically shows a system according to the first aspect for monitoring a state of a fluid in an indoor space 10 including a state of a flow field for said fluid. The system includes an input unit 81 with a plurality of temperature sensors 81a, 81b, . . . , $81m_T$ to provide respective temperature measurement data $y_{1T}^k, y_{2T}^k, \ldots, y_{mT}^k$ indicative for a temperature field in said indoor space 10 at a point in time k. The temperature sensors may be any type, provided that these sensors are capable of providing a signal that is indicative of a locally measured temperature at point in time k. The temperature sensors may in addition to the signal indicative for the measured temperature, provide a signal representing a time-stamp specifying the point in time at which the measurement was performed. Additionally the temperature sensors may issue a status signal, e.g. indicative for a reliability of the measurement, a battery status etc. The signals may be issued wired or wireless.

The system includes a simulation unit 82 to simulate a fluid in said indoor space according to an indoor climate model to predict a state of said fluid in said indoor space including at least a temperature field T* and a flow field of the fluid in said indoor space, and has an output 821 to at least provide a signal indicative for said flow field. The output 821 may provide one or more additional signals, for example a signal indicative for the temperature field.

The system includes a comparison unit 83 to compare the predicted temperature field T* with a temperature field indicated by the temperature measurement data $y_{1T}^k, y_{2T}^k, \ldots, y_{mT}^k$, and a state correction unit 84 to correct the predicted state of the fluid based on a comparison result of said comparison unit 83.

Typically the indoor climate model is arranged as a CFD model, for example based on the Navier Stokes equations. In an embodiment the number of cells used for the CFD model may correspond to the number of temperature sensors. I.e. each cell may be associated with a respective temperature sensor $81i$ to provide a signal indicative of a measure temperature used for correction of the estimated $Y_i^k$ to be compared with the predicted temperature for said cell i. In practice the number of cells is typically much larger than the number of temperature sensors. In that case a proper mapping is required. According to a first approach the actual temperature for each cell may be estimated by interpolation from the measured temperatures.

According to another, more accurate approach, a comparison is made between the actually measured temperatures and the modeled temperatures of the cells that correspond to the positions for which a temperature measurement is available.

Figure 2:
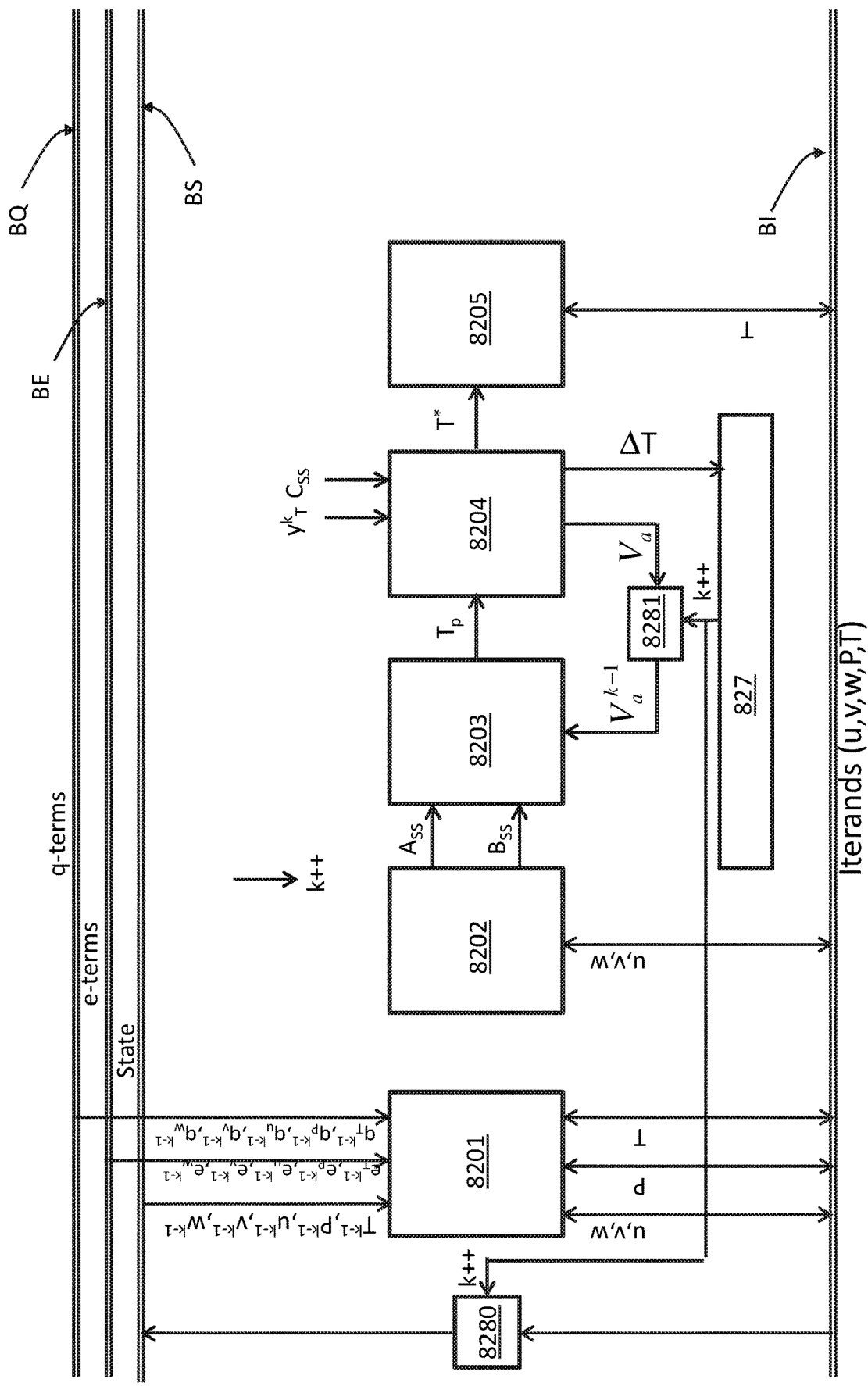
FIG. 2 shows an embodiment of a monitoring system according to the first aspect of the present invention.

Provided that the temperature sensors operate sufficiently reliable a fixed mapping may be applied. Alternatively, this mapping for example by a mapping matrix ($C_{SS}$) may be dynamically determined to take into account the case that temperature sensors are removed or added. It may further be considered to use mobile temperature sensors having a variable position as a function of time. In that case the mapping matrix $C_{SS}$ may be adapted according to their current position FIG. 2 shows part of an embodiment of the system in more detail. As shown, the simulation unit 82 therein comprises a state estimation unit 8201, a matrix update module 8202 and a Kalman prediction module 8203. Furthermore respective data buses BS, BE, BQ and BI are provided for system state data $u^{k-1}, v^{k-1}, w^{k-1}, P^{k-1}, T^{k-1}$, boundary condition data $e_u^{k-1}, e_v^{k-1}, e_w^{k-1}, e_T^{k-1}, e_P^{k-1}$, source term data $q_u^{k-1}, q_v^{k-1}, q_w^{k-1}, q_T^{k-1}, q_P^{k-1}$ and iterand data u,v,w,P,T.

The state estimation unit 8201 is arranged to execute an iteration (u,v,w,P) in an estimation of at least a flow field and a pressure field based at least on a previous known state of the fluid ($u^{k-1}, v^{k-1}, w^{k-1}, P^{k-1}, T^{k-1}$), according to the indoor climate model. Upon initiating a next series iterations for computing a subsequent predicted state for time k the iterants u,v,w,P,T may be initialized to the vectors $u^{k-1}$, $v^{k-1}, w^{k-1}, P^{k-1}, T^{k-1}$ representing the previous state. If no previous state is available, for example upon start-up or reset of the system the iterants may be initialized to zero-vectors or random vectors. The matrix update module 8202 is arranged to update a first and a second state evolution matrix ($A_{SS}, B_{SS}$) using a model for the temperature field defined by $$A_T(u,v,W)T = B_e e_T^{k-1} + B_q q_T^{k-1} + A_0 T^{k-1}$$

The Kalman prediction module 8203 is arranged to estimate a temperature field (Tp) of the fluid in the indoor space 10 using the first and second state evolution matrix ($A_{SS}$, $B_{SS}$).

The comparison unit 83 in this embodiment is formed by a Kalman evaluation module 8204. The Kalman evaluation module 8204 is arranged to update the predicted temperature field ($T_p$) to an updated temperature field ($T^*$) by comparing the temperature measurement data ($y_T^k$) with said predicted temperature field (Tp).

The state correction unit 84, here is formed by a temperature iteration module 8205 for generating an iterated value T for a temperature field based on the comparison result.

The calculations for the updating the predicted temperature field and for generating the iterated value T may be combined, e.g. by the computation $$T = (1-\alpha)T + \alpha(T^* + K(y - C_{SS}T^*))$$

The system includes a controller 827 that is arranged to verify if a difference ΔT between subsequent iterations for the temperature field (Tp) predicted by the Kalman prediction module 8203 comply with a predetermined requirement. The predetermined requirement may for example imply that the average difference between temperatures of the subsequent iterations for the predicted temperature field may not exceed a threshold value. Alternatively the predetermined requirement may imply that the difference between subsequent iterations for the predicted temperature field nowhere exceed a threshold value. Any other suitable alternative predetermined requirement may be used as long as it is suitable to be indicative for convergence of the predicted temperature field Tp. The controller 827 is further arranged to cause the simulation unit 8201, 8202, 8203 to perform a next iteration until the difference complies with the predetermined requirement. The controller 827 causes a state renew unit 8280 to update the estimated state of the fluid according to an iterated value for said state if said difference complies with the predetermined requirement. I.e. upon compliance the controller 827 issues a control signal k++ that replaces the state for point in time k−1 of the fluid by the state for the next point in time k given by $$T^k = T; u^k = u; v^k = v, w^k = w; P^k = P$$

In the embodiment shown the controller 827 further causes a second update unit 8281 to update a state error covariance matrix ($V_a^k$) according to $$V_a^k = (I - K C_{SS})V_p$$

In FIG. 2 this is schematically illustrated by a first gate 8280 that carries over iterant data from the iterant bus BI to the system state bus BS upon issue of a control system k++ by the controller 827. Also in response to this control signal, the gate 8281 updates a covariance matrix $V_a^k$ by its iterant Va.

Figure 3:
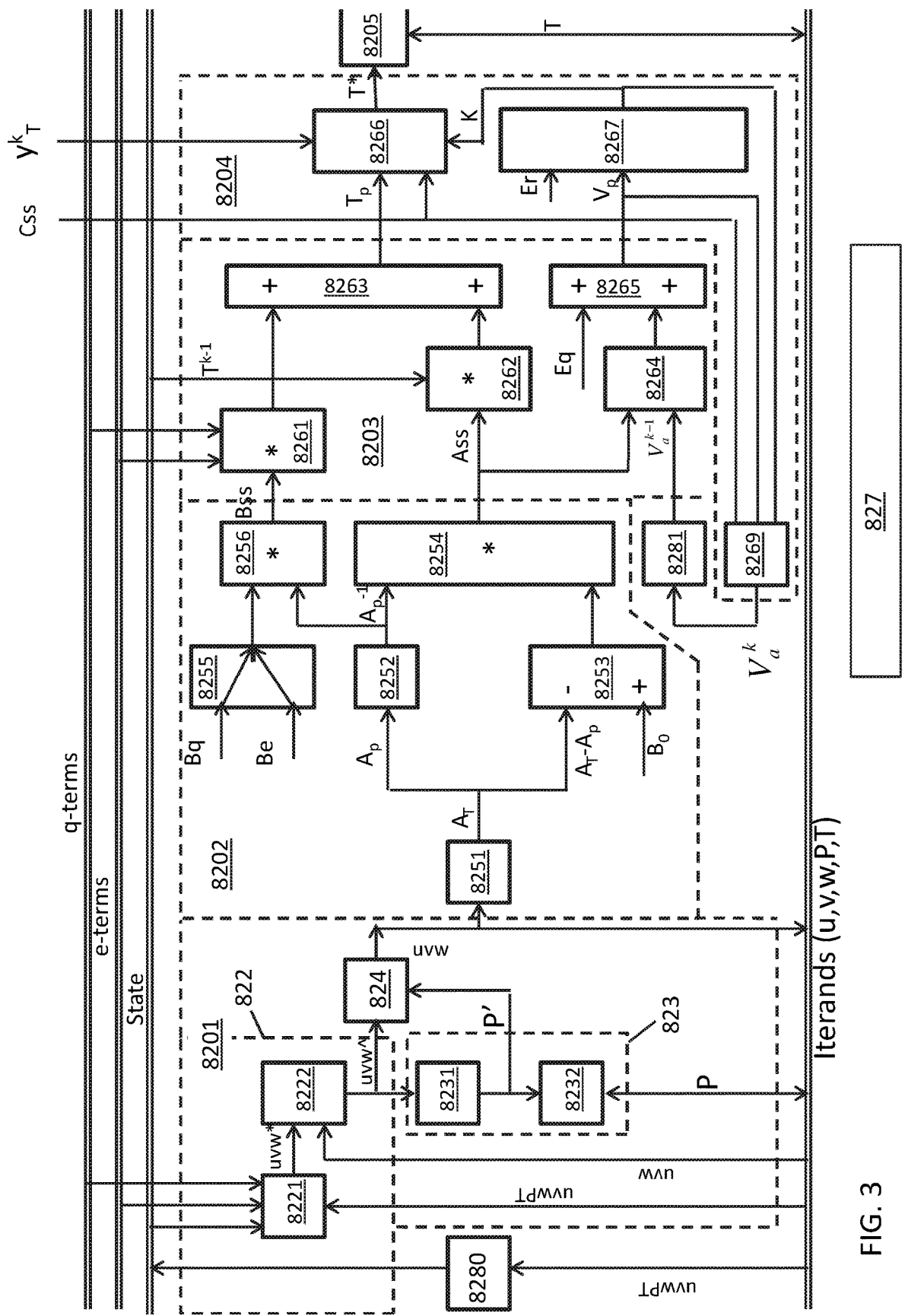
FIG. 3 shows an embodiment of a monitoring system according to the first aspect of the present invention.

FIG. 3 shows parts of an embodiment of a system according to the first aspect in still more detail. In the embodiment shown in FIG. 3, the state estimation unit 8201 comprises a flow estimation unit 822 to provide an estimation (') of a flow (u,v,w) in respective orthogonal directions (x,y,z). To that end the flow estimation unit 822 has an equation solving unit 8221 that solves u*,v*, w* from $$A_u(u,v,w,P)u^* = b_u(u^{k-1}, q_u^{k-1}, e_u^{k-1})$$

$$A_v(u,v,w,P)v^* = b_v(v^{k-1}, q_v^{k-1}, e_v^{k-1})$$

$$A_w(u,v,w,P)w^* = b_w(T, w^{k-1}, q_w^{k-1}, e_w^{k-1})$$

The flow estimation unit 822 also has an update unit 8222 that calculates the weighted sums $$\hat{u} = (1-\alpha)u + \alpha u^*$$

$$\hat{v} = (1-\alpha)v + \alpha v^*$$

$$\hat{w} = (1-\alpha)w + \alpha w^*,$$

Therein u,v,w are corrected values of previously iterated values for the flow, and α is a weighting factor in a range between 0 and 1.

The state estimation unit 8201 has a pressure data processing module 823 to calculate a pressure correction P', schematically indicated by part 8231, according to $$A_p(\hat{u},\hat{v},\hat{w})P' = b_p(\hat{u},\hat{v},\hat{w})$$

and to update the pressure field P, schematically indicated by part 8232, based on the pressure correction P', using $$P = P + \alpha_p P'$$

The state estimation unit 8201 further includes a correction module 824 to correct the flow field u,v,w using said pressure correction P' using $$(u,v,w) = f((\hat{u},\hat{v},\hat{w}),P')$$

An embodiment of the matrix update module 8202 is shown in more detail in FIG. 3. The matrix update module 8202 updates the first and the second state evolution matrix $A_{SS}$, $B_{SS}$ using the model for the temperature field defined by $$A_T(u,v,w)T = B_e e_T^{k-1} + B_q q_T^{k-1} + B_0 T^{k-1}.$$

In the embodiment shown, the matrix update module 8202 includes a first part 8251 that calculates the matrix $A_T$ from input u,v,w. A more elaborate disclosure of the matrix update module 8202 is postponed to a further part of the description.

The Kalman prediction module 8203 includes parts 8261, 8262, 8263 to estimate a predicted temperature field $T_p$ for a subsequent point using said first and second state evolution matrix $A_{SS}$, $B_{SS}$, with the following equation $$T_p = A_{SS} T^{k-1} + B_{SS}(q_T^{k-1} e_T^{k-1})$$

The Kalman prediction module 8203 also includes parts 8264, 8265 of the Kalman filter module to calculate a predicted covariance matrix $V_p$ according to:

$$V_p = A_{SS} V_a^{k-1} A_{SS}^T + E_Q,$$

The Kalman evaluation module 8204 is provided to update the predicted temperature field ($T_p$) to an updated temperature field (T*) by merging the temperature measurement data ($y_T^k$) with respective predicted values $C_{SS} T_p$ based on said predicted temperature field (Tp) according to $T^* = T_p + K(y_T^k - C_{SS} T_p)$. To that end Kalman gain matrix K is obtained by part 8267 according to:

$$K = V_p C_{SS}^T (C_{SS} V_p C_{SS}^T + E_R)^{-1}$$

The coefficients of the measurement error covariance matrix $E_R$ may have a fixed value, for example on the basis of accuracy specification provided by the manufacturer of the temperature sensors. Alternatively, these coefficients may be determined dynamically. For example, it may be determined for respective temperature sensors at which point in time they reported their most recent measurement and the corresponding covariances may be increased in accordance with the lapse of time since said most recent reporting.

In addition part 8269 calculates the analysis state error covariance matrix $V_a^k$ according to $$V_a^k = (I - K C_{SS}) V_p$$

The state correction unit 8205 then iterates the iterant T for the temperature field, for example by $$T = (1-\alpha)T + \alpha T^*,$$

wherein α is a weighting factor in a range between 0 and 1. It may be considered to integrate the state correction unit 8205 with the comparison unit 8204.

The particular embodiment of the matrix update module 8202 as is shown in FIG. 3 is now described. This particular embodiment is based on the following observations. In general, in a CFD simulation the change in field T from point in time k-1 to k may be described as $$A_T T^k = B_e e_T^{k-1} + B_q q_T^{k-1} + B_0 T^{k-1} \quad (1a)$$

Therein, $e_T^{k-1}$ contains the boundary conditions, $q_T^{k-1}$ contains the source terms for the field T, and $B_e, B_q, B_0$ are matrices, wherein $B_0$ is a constant diagonal matrix, Based on the above constraints a State Space (SS) representation of the following form is constructed:

$$T^k = A_{SS} T^{k-1} + B_{SS} q^{k-1} \quad (2)$$

$$y^k = C_{SS} T^k + D_{SS} q_T^k \quad (3)$$

Typically the matrix $D_{SS}$ is equal to the zero matrix.

The other state evolution matrices are determined as follows.

First equation 1a) can be rewritten as $$A_T T^k = B_0 T^{k-1} + [B_q B_e][q_T^{k-1}; e_T^{k-1}] \quad (1c)$$

Accordingly, $T^k$ can be expressed as:

$$T^k = A_T^{-1} A_0 T^{k-1} + A_T^{-1}[B_q B_e][q_T^{k-1}; e_T^{k-1}] \quad (1d)$$

Therewith the matrices $A_{SS}, B_{SS}$ in equation 2 can be computed as:

$$A_{SS} = A_T^{-1} B_0 \quad (4a)$$

And $$B_{SS} = A_T^{-1}[B_q B_e] \quad (4b)$$

This computation requires a large amount of processing power as it requires an inversion of the high dimensional matrix $A_T$.

The matrix update module 8202 uses the following approach to reduce the computational effort while providing a reasonably accurate approximation of the exact solution. This can be seen as follows.

The matrix $A_T$ can be rewritten as $A_T = A_p + (A_T - A_p)$, such that $A_p$ and $(A_T - A_p)$ respectively contain the diagonal terms and the non-diagonal terms of the matrix $A_T$.

The diagonal part $A_p$ of the matrix is a measure of the internal energy of the cells. The non-diagonal part describes the effect of transport of temperatures at point in time k on the temperature field at point in time k.

Provided that the applied time steps are relatively small, i.e. small with respect to an order of magnitude of a time constant indicative for the thermal dynamics of the system, the assumption may be made that the effect of transport of temperatures at point in time k on the temperature field at point in time k is approximately equal to the effect of transport of temperatures at point in time k-1 on the temperature field at point in time k.

With this assumption equation 1c) may be approximated by:

$$[A_p A_T - A_p][T^k; T^{k-1}] = A_0 T^{k-1} + [B_q B_e][q_T^k; e_T^k] \quad (1cc)$$

Therewith the state space model for $T^k$ is approximated as follows.

$$T^k = A_p^{-1}(A_0 + A_p - A_T)T^{k-1} + A_p^{-1}[B_q B_e][q_T^{k-1}; e_T^{k-1}] \quad (1dd)$$

Hence the expression for the matrix $A_{SS}$ as approximated by parts 8252 and 8253 and 8254 is:

$$A_{SS} = A_p^{-1}(B_0 + A_p - A_T) \quad (4aa)$$

And $B_{SS}$ is approximated with parts 8255 and 8256 as $$B_{SS} = A_T^{-1}[B_q B_e] \quad (4bb)$$

Figure 4:
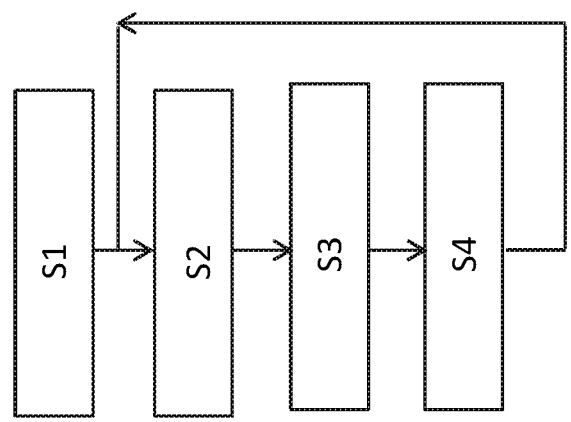
FIG. 4 shows an embodiment of a monitoring method according to the second aspect of the present invention.

FIG. 4 schematically illustrates a method according to the second aspect of the present invention for monitoring a state of a fluid in an indoor space, wherein the state of the fluid in an indoor space 10 includes a state of a flow field for the fluid. Typically the fluid is air, which may comprise water vapor. The saturation level of water therein may also be monitored as a state. Other state variables are a temperature field and a pressure field.

The method for monitoring the state comprises a first step S1, wherein temperature measurement data $y_{1T}^k, y_{2T}^k, \ldots, y_{mT}^k$ is obtained that is indicative for a temperature field in the indoor space 10. As a second step S2 a simulation of the fluid is performed according to an indoor climate model, to predict a state of said fluid including at least a temperature field and a flow field for the fluid in said indoor space. Step S3 compares the predicted temperature field $T_p$ with the temperature measurement data $y_T^k$. As a third step S4 a corrected state (of said indoor space is calculated on the basis of a comparison of the predicted temperature field ($T_p$) and the temperature measurement data ($y_T^k$). Upon convergence the corrected state $T^k; u^k; v^k; w^k; P^k$ is an estimation of the actual state of the fluid at point in time k and therewith also an estimation of the actual state of the flow field of the fluid. This avoids a direct measurement of the flow field of the fluid. Steps S2, S3 and S4 will typically be executed iteratively as indicated by the loop from S4 back to S2. I.e. each iteration contributes to the calculation of the corrected state, but the correction of the state is completed when the iterative process is ended.

Figure 5:
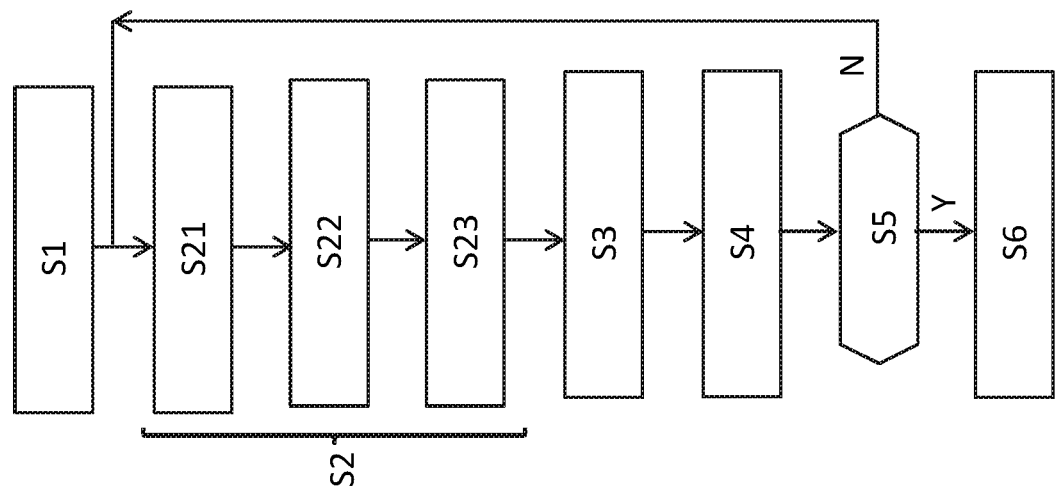
FIG. 5 shows an embodiment of a monitoring method according to the second aspect of the present invention.

FIG. 5 shows an embodiment of the method in more detail. Steps therein corresponding to those in FIG. 4 have the same reference number. Substeps of the steps described for FIG. 4 are indicated by an additional digit. Therein the step S2 of simulating the fluid more in particular comprises a first substep S21 wherein the indoor climate model is used to calculate an iteration u,v,w,P in an estimation of at least a flow field and a pressure field based at least on a previous known state of the fluid ($u^{k-1}, v^{k-1}, w^{k-1}, P^{k-1}, T^{k-1}$).

In a second substep S22 of the second step the data from this iteration and a model for the temperature field defined by $$A_T(u,v,w)T = B_e e_T^{k-1} + B_q q_T^{k-1} + B_0 T^{k-1}$$

are used to update a first and a second state evolution matrix $A_{SS}, B_{SS}$.

The matrices $A_{SS}, B_{SS}$ may be computed as:

$$A_{SS} = A_T^{-1} B_0$$

And $$B_{SS} = A_T^{-1} [B_q B_e]$$

However, as described above, a relatively accurate approximation, can be applied that only requires inversion of the diagonal part of matrix $A_T$, therewith substantially reducing computation load.

In a third substep S23 of the second step a Kalman prediction step is applied to predict a temperature field Tp using the first and second state evolution matrix $A_{SS}, B_{SS}$.

In the embodiment shown the comparison step S3 comprises applying a Kalman evaluation step to update the predicted temperature field $T_p$ to an updated temperature field T* by merging the temperature measurement data ($y_T^k$) with the predicted temperature field Tp.

The step S4 of calculating a corrected state comprises generating an iterated value for a temperature field based on the comparison result.

As the estimator is applied here as part of the iterative process all relations are discretized and linearized. This makes it possible to use a Kalman filter as the estimator. Therewith more complicated solutions (e.g. unscented Kalman filter, extended Kalman filter or particle filter) are avoided that would be required if an estimator were applied separately from this iterative process.

Steps S2 to S4 are followed by a verification step S5. Therein it is verified
if a difference ΔT between subsequent iterants for the temperature field Tp predicted with the Kalman prediction step complies with a predetermined requirement.

Upon detection that the difference ΔT does not comply (N) with the predetermined requirement steps S2 to S4 are repeated. Upon detection that the difference ΔT complies (Y) with the predetermined requirement, the correction of the state is completed and in the subsequent step S6 the estimated state of the fluid is updated according to an iterated value for said state.

Figure 6:
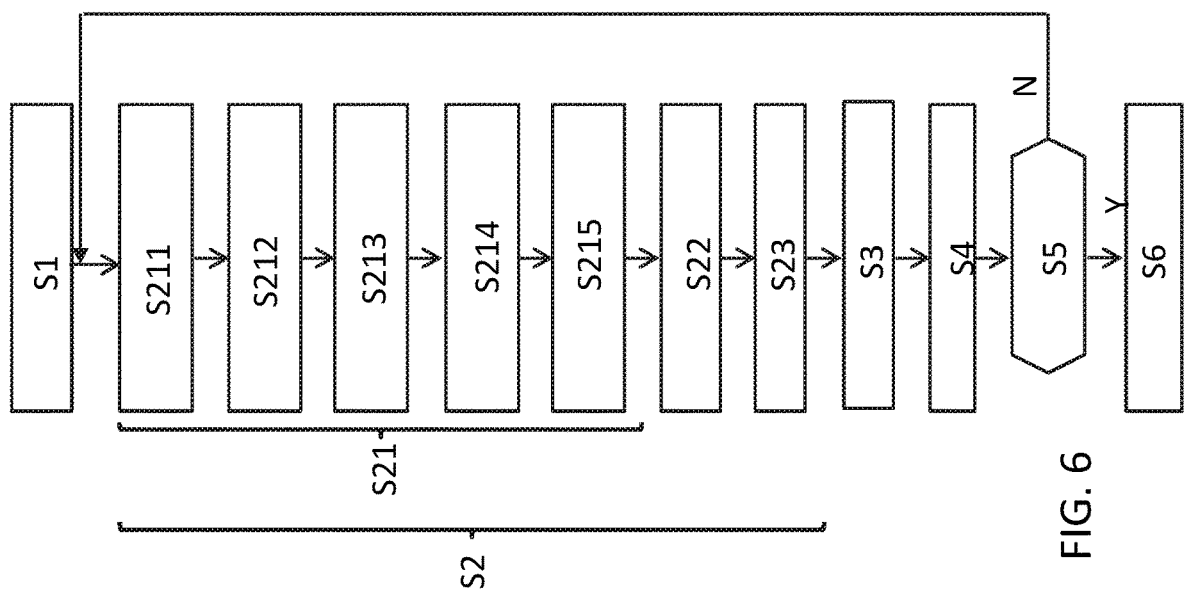
FIG. 6 shows an embodiment of a monitoring method according to the second aspect of the present invention.

FIG. 6 shows an embodiment of the method according to the second aspect of the invention in still more detail. Steps therein corresponding to those in FIG. 5 have the same reference. Substeps of steps described with reference to FIG. 5 are indicated by an additional digit. The iteration S21 of the estimation comprises providing an estimation (û,v̂,ŵ) of a flow (u,v,w) in respective mutually orthogonal directions (x,y,z). This is achieved by first solving in subsubstep S211 intermediate values (u*,v*, w*) from $$A_u(u,v,w,P)u^* = b_u(u^{k-1}, q_u^{k-1}, e_u^{k-1})$$

$$A_v(u,v,w,P)v^* = b_v(v^{k-1}, q_v^{k-1}, e_v^{k-1})$$

$$A_w(u,v,w,P)w^* = b_w(T, w^{k-1}, q_w^{k-1}, e_w^{k-1}),$$

and by subsequently calculating in subsubstep S212 the following weighted sums $$\hat{u} = (1-\alpha)u + \alpha u^*$$

$$\hat{v} = (1-\alpha)v + \alpha v^*$$

$$\hat{w} = (1-\alpha)w + \alpha w^*.$$

Therein u,v,w are corrected values corresponding to previous iterated values for the flow, and α is a weighting factor in a range between 0 and 1.

The iteration in substep S21 further involves calculating S213 a pressure correction (P') according to $$A_p(\hat{u},\hat{v},\hat{w})P' = b_p(\hat{u},\hat{v},\hat{w})$$

and updating S214 the pressure field (P) based on the pressure correction (P'), $$P = P + \alpha_p P',$$

followed by updating S215 the motion field u,v,w using the pressure correction P' with the equation $$(u,v,w) = f((\hat{u},\hat{v},\hat{w}),P')$$

The Kalman prediction substep S23 uses the first and second state evolution matrix, according to:

$$T_p = A_{SS} T^{k-1} + B_{SS}(q_T^{k-1} e_T^{k-1})$$

$$V_p = A_{SS} V_a^{k-1} A_{SS}^T + E_Q.$$

Then the Kalman evaluation step S3 is applied to update the predicted temperature field $T_p$ to the updated temperature field T* by merging the temperature measurement data $y_T^k$ with respective predicted values $C_{SS}T_p$ based on said predicted temperature field Tp according to the following set of equations $$K = V_p C_{SS}^T (C_{SS} V_p C_{SS}^T + E_R)^{-1}$$

$$T^* = T_p + K(y_T^k - C_{SS} T_p).$$

Figure 7:
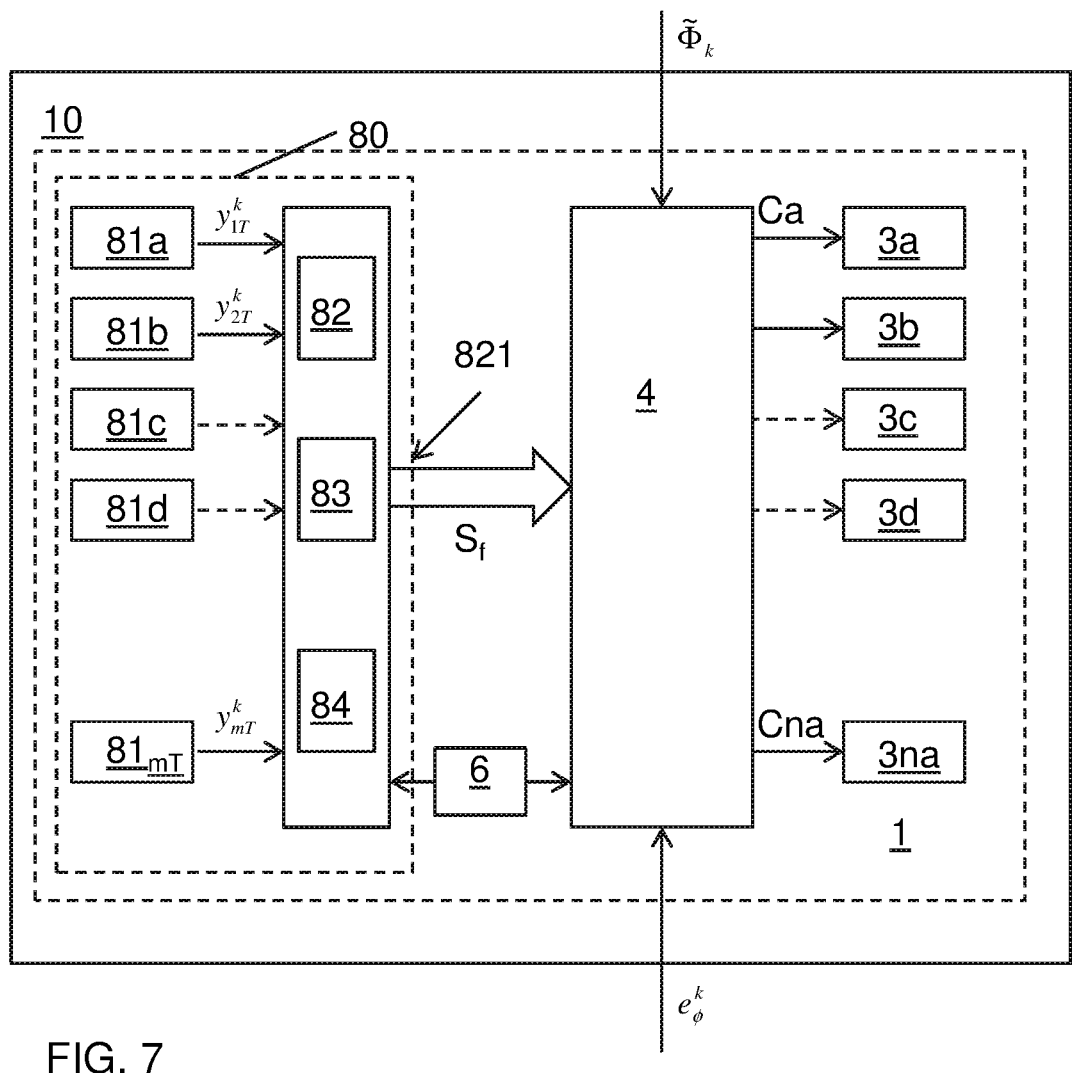
FIG. 7 shows an embodiment of a climate control system according to the third aspect of the present invention.

FIG. 7 schematically shows a climate control system 1 for controlling a climate in an indoor space 10. The climate control system 10 comprises a monitoring system 80 according to the present invention for example as presented in FIG. 1,2 or 3, including a plurality of sensors 81a, ... 81mT and further a simulation unit 82, a comparison unit 83 and a state correction unit 84. These units 82, 83, 84 cooperate to calculate an estimated state Sf of the fluid in the indoor spaced on the basis of the temperature measurement data provided by said plurality of sensors. The state Sf of the fluid may include the state of its flow field, its temperature field and its pressure field. Additionally the state may include further state information, such as a field representing relative saturation of water vapor and a field representing a carbon dioxide concentration. Other monitoring systems may be provided to determine additional state information, for example state information related to the aforementioned water vapor saturation or carbondioxide concentration. The climate control system further comprises a plurality of actuators 3a, ..., 3na for controlling climate related variables in said environment. A data processor 4, here serving as a controller controls the actuators 3a, ..., 3na on the basis of the sensory data $$y_{1T}^k, y_{2T}^k, \ldots, y_{mT}^k.$$

To that end the data processor 4 jointly resolves a set of coupled optimization problems of the following form:

$$z_\Phi^k = \arg\min_{z_\Phi}([S_\Phi^{k+1}O]z_\Phi - \tilde{\Phi}^{k+1})^T Q_\Phi^k ([S_\Phi^{k+1}O]z_\Phi - \tilde{\Phi}^{k+1}) + ([OI]z_\Phi)^T R_\Phi^k ([OI]z_\Phi)$$ (5a)

Subject to $$[A_\Phi^k - B_\Phi^k]z_\Phi - b'_\Phi^k(\Phi^k, e_\Phi^k) = 0$$ (5b)

Therein, $$z_\Phi^k = \begin{bmatrix} \Phi^{k+1} \\ q_\Phi^k \end{bmatrix}$$

is an estimated optimum value for the augmented state vector, $\Phi^*$ specifying the spatial distribution of a climate related variable with respect to a plurality of spatial cells and $q_\Phi^k$ being a source term to be resolved that is associated with said vector. Furthermore, $\tilde{\Phi}$ is a vector specifying a setpoint for said climate related variable for at least a part of said plurality of cells. S is a selection matrix, selecting cells for said distribution having a setpoint, O is the zero matrix, I is the identity matrix and Q and R are weighting matrices. These matrices Q, R respectively specify the relative weighting applied to the accuracy with which the vector found as a result of the solution of the optimization problem matches the set-points and the accuracy with which the energy consumption restrictions are met by the solution.

Furthermore, $A_\Phi$ is a matrix that defines the development of a vector $\Phi$ as a function of one or more other vectors of climate related variables and $B_{101}$, is a matrix that maps the source terms for field $\Phi$ to the cell field values affected by those source terms. The data processor, using control signals Ca ... Can, controls the plurality of the actuators 3a to 3na in accordance with the source term $q_\Phi$ found by resolving the above-mentioned optimization problem.

The climate control system 1 may control one or more variables s of the indoor climate in the indoor space 10. Example of said variables, are a temperature distribution, a pressure distribution, flow fields, an air humidity distribution etc. The actuators 3a, ..., 3na of the climate control system 1 to control one or more of these variables may include for example one or more of heaters, air-conditioners, ventilators, pumps, humidifiers, dryers, etc. The sensors 2a, ..., 2n used to measure a current state of the climate may include thermal sensors, flow sensors, pressure sensors, air humidity sensors etc.

Typically, the number of sensors 2a, ..., 2n is much less than the number of cells involved in the computation. In the embodiment shown, the climate control system 1 further includes a mapping unit, formed by monitoring system 80 that estimates a current value of a field for each cell on the basis of the sensed values for the field as obtained from the sensors. The mapping unit 80 may for example provide the estimation on the basis of an interpolation of sensed values.

In the embodiment the data processor 4 and the mapping unit 80 are programmable devices. In this case the system 1 as shown includes a computer program product 6 that comprises a program for controlling the data processor 4 and the mapping unit 80. Alternatively, the data processor 4 and/or the mapping unit 80 may be provided as dedicated hardware or as a combination of dedicated hardware and programmable elements.

Figure 8:
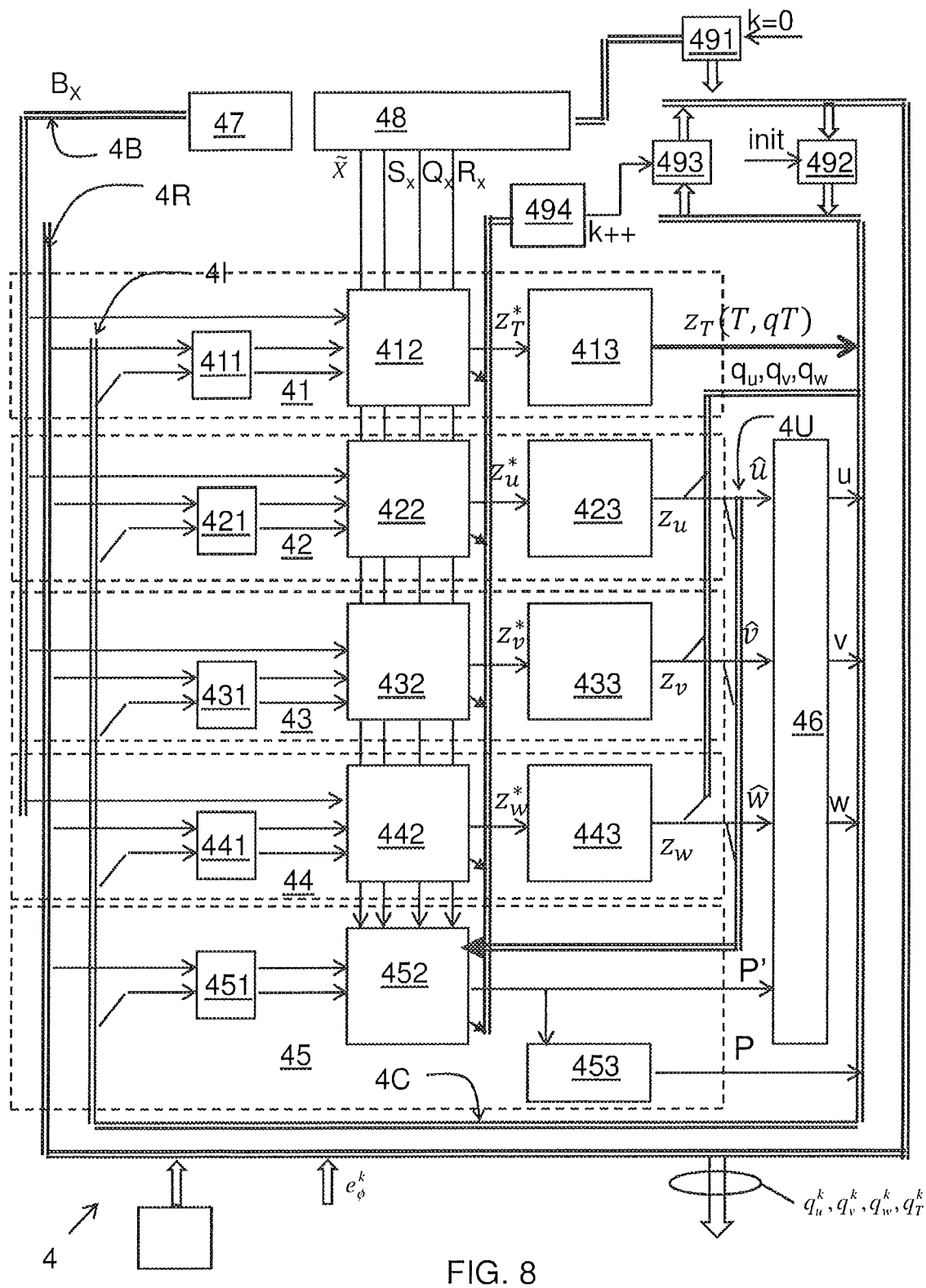
FIG. 8 shows a data processor for use in a climate control system according to the third aspect of the invention.
Figure 9:
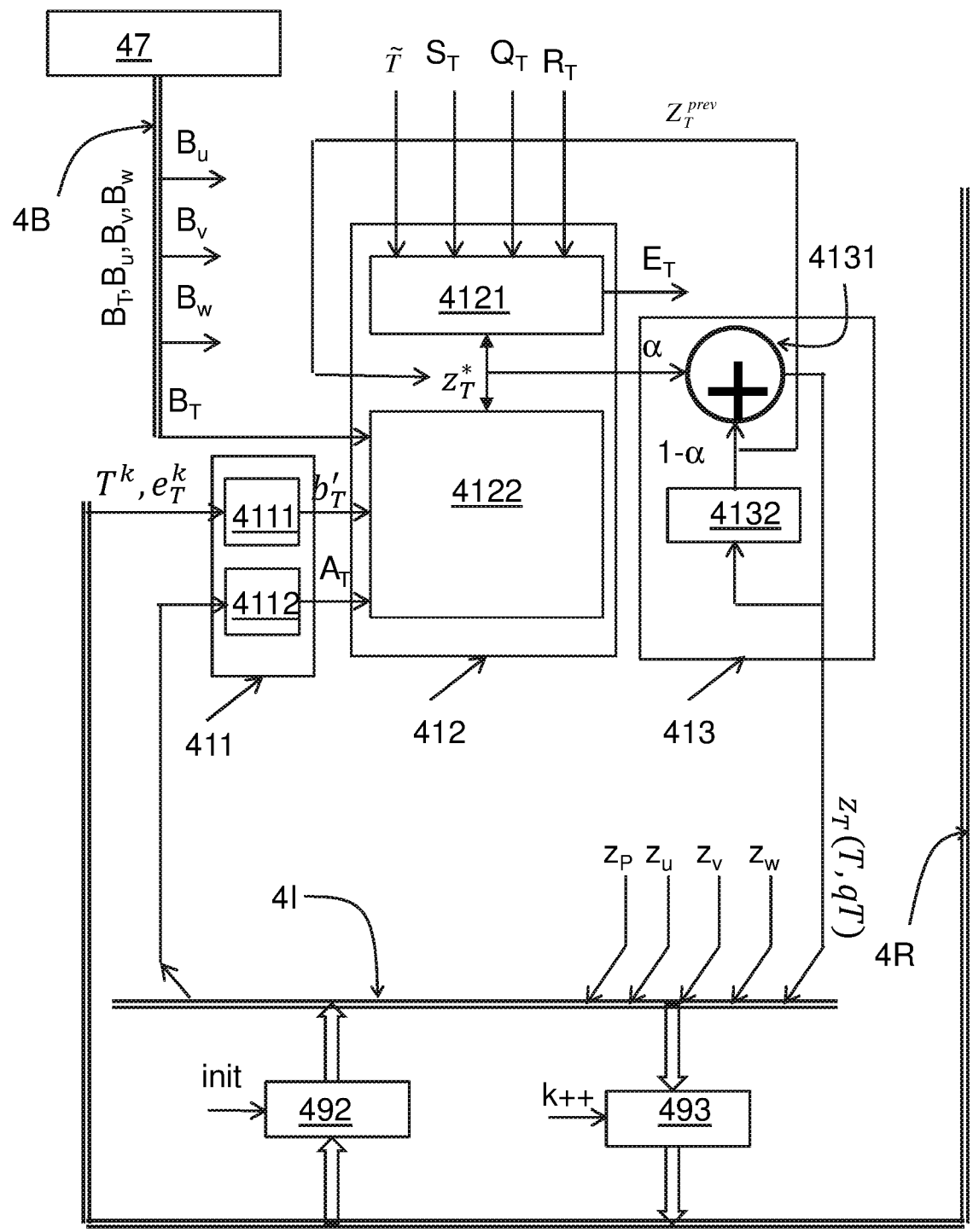
FIG. 9 shows an embodiment of a module of the data processor according to FIG. 8.
Figure 10:
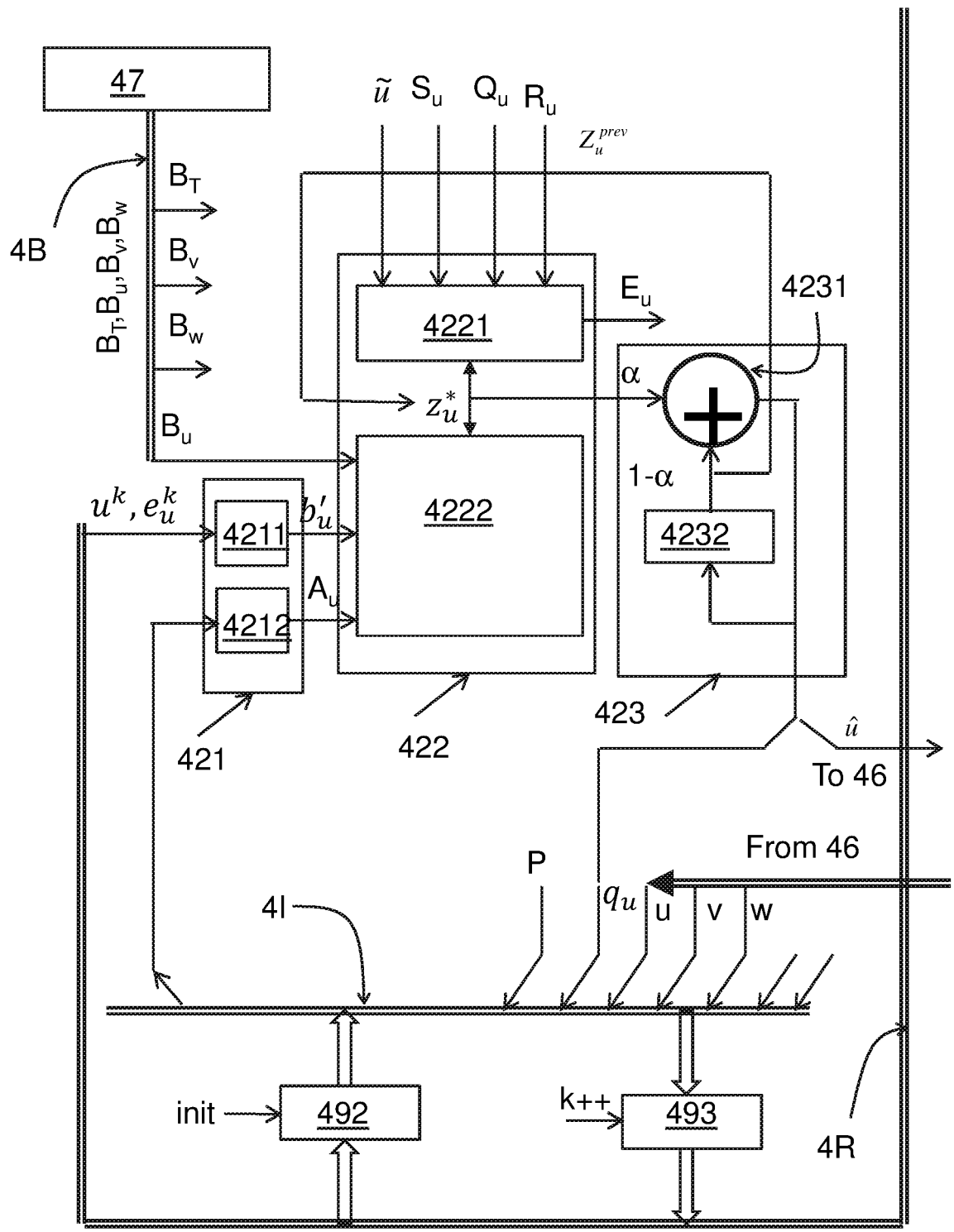
FIG. 10 shows an embodiment of another module of the data processor according to FIG. 8.
Figure 11:
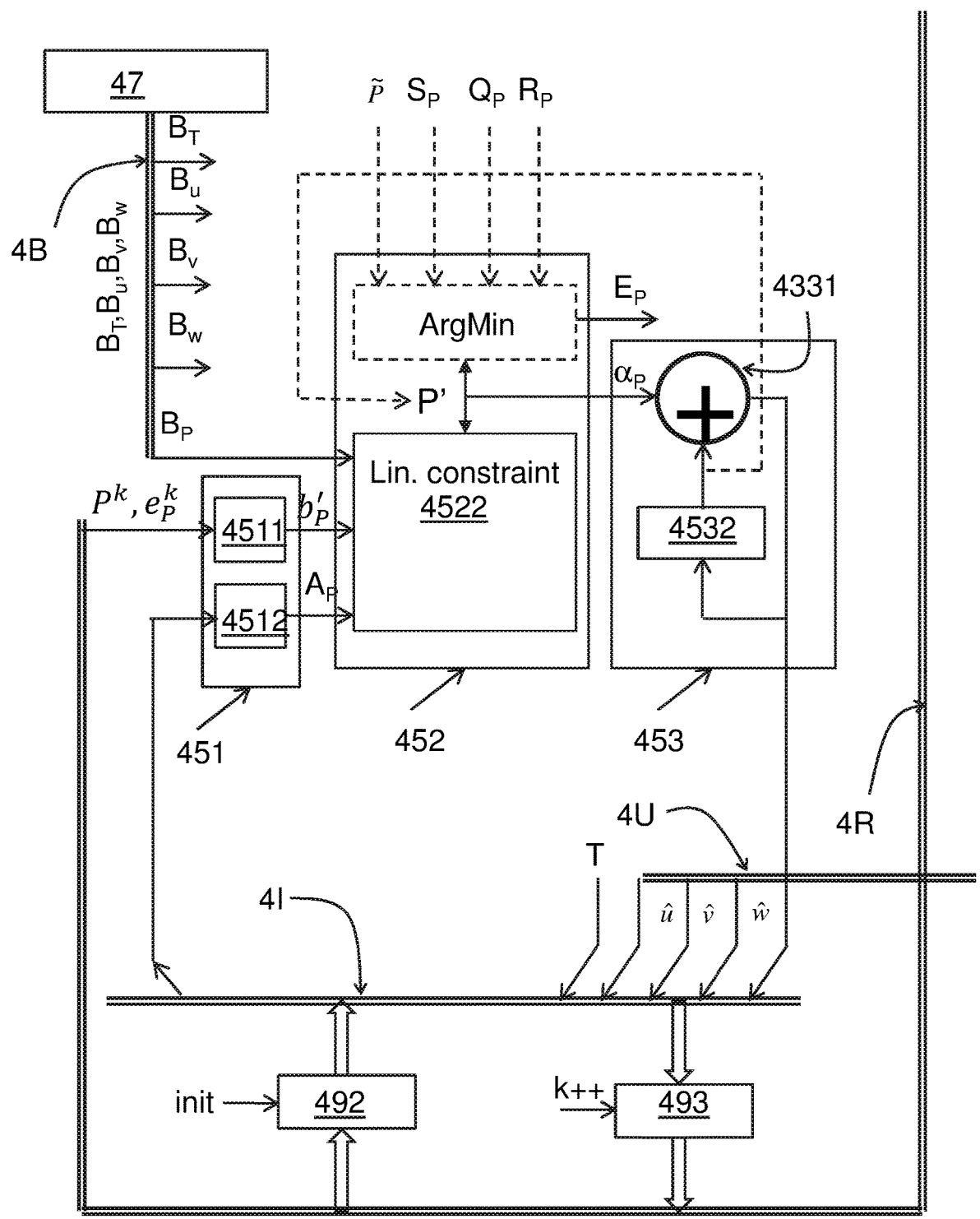
FIG. 11 shows an embodiment of again another module of the data processor according to FIG. 8, FIG. 12A, 12B schematically show parts of the data processor according to FIG. 8.

An embodiment of the data processor 4 is shown in more detail in FIG. 8. Dependent on the number of climate variables that have to be controlled, the data processor 4 may include a different number of modules that are mutually inter connected. In the embodiment shown the data processor 4 comprises a temperature data processing module 41, a first, a second and a third flow data processing module 42, 43, 44 and a pressure data processing module 45. These modules each include a preparation unit (411, 421, 431, 441 and 451 respectively), a solve unit (412, 422, 432, 442 and 452 respectively), and an update unit (413, 423, 433, 443 and 453 respectively). Embodiments of these modules are described with reference to FIGS. 9, 10 and 11. Therein FIG. 9 shows the temperature data processing module 41 in more detail. FIG. 10 shows the first flow data processing module 42 in more detail. The other two flow data processing modules 43, 44 substantially correspond to the first flow data processing module 41. However, in the third flow data processing module 44 the components of the vector $b'_w$ are also dependent on the temperature field to take into account buoyant convection effects. FIG. 11 shows the pressure data processing module 45 in more detail.

The data processor further includes a correction module 46 that corrects the flow fields estimated by the flow data processing modules 42, 43, 44.

The data processor 4 further includes a source mapping module 47 that generates matrix data that map the source terms to the variables directly actuated by the actuators represented by the source terms.

The data processor 4 further includes a user input module 48, enabling a user to control operation of the system.

Figure 13:
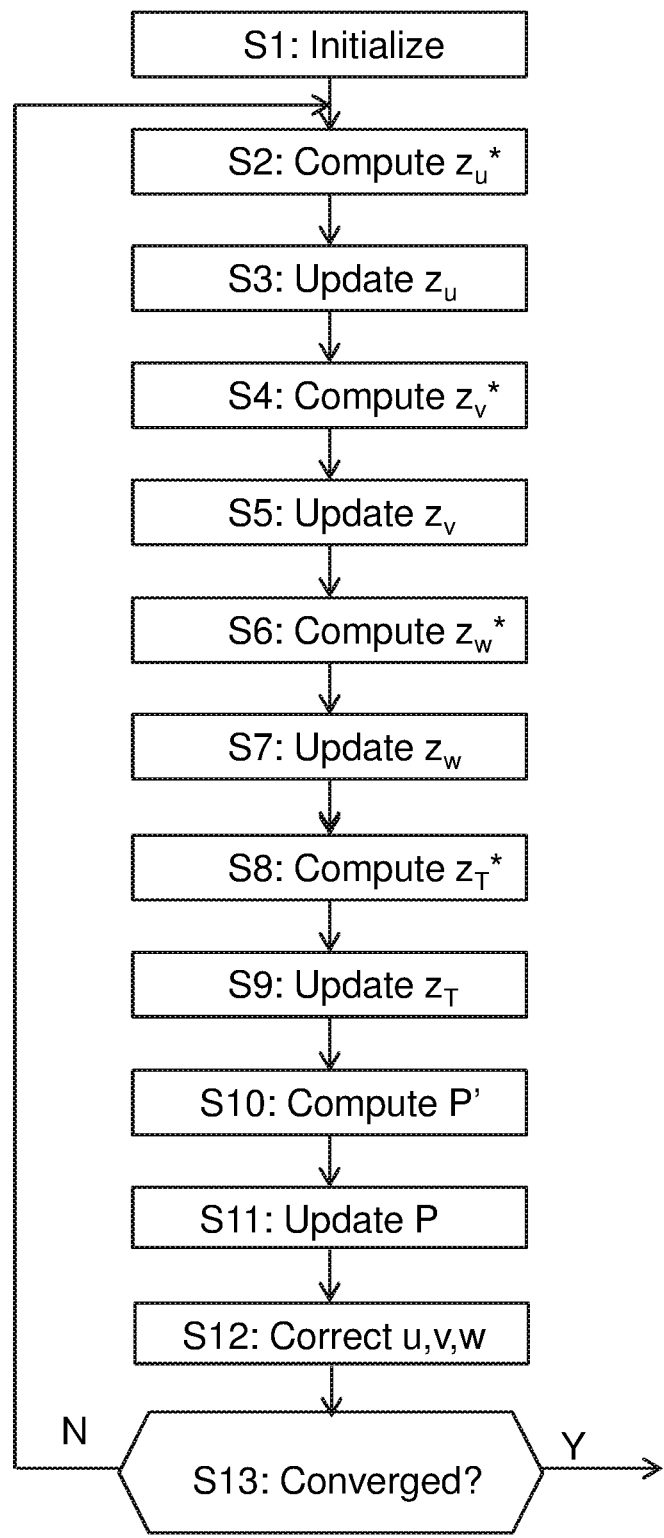
FIG. 13 shows a control method according to the fourth aspect of the present invention.

The data processor 4 further comprises datapath facilities 4R, 4I, 4C, 4B, 4U and datapath control elements 491, 492, 493, 494, Operation of the data processor 4 in the system 1 is now described with reference to a flow chart shown in FIG. 13. The flow chart illustrates an iterative procedure with which the values for the source terms that are required to approach the specified set points for climate related variables. Upon convergence of the procedure the values for the source terms for a time step k become available, and the procedure can be repeated to determine the source term values for the next time step k+1.

In the embodiment shown the data processor 4 is arranged as a programmable general purpose processor. The data processor 4 is coupled to memory 6 comprising a computer program that causes the programmable processor to carry out the climate control method.

In an optional first step S1 all variables are assigned an estimated or known initial value where possible. Variables for which a value is not known or can be estimated, are assigned a random value. If available, however, the known or estimated value should be used to obtain a more rapid convergence. In the embodiment of FIG. 8, this is achieved by transferring the initial values via data path control element 491, responsive to signal "k=0", to a results bus 4R. Subsequently these values are gated to the iterands bus 4I by data path control element 492, responsive to signal "init".

If values are available that are obtained in a previous time step k, it suffices to gate these values to the iterands bus 4I by data path control element 492.

Subsequently the sequence of steps S2-S11 is iterated until convergence is detected in step S12. Therewith the results for the next time step k+1 are obtained.

In step S2 the value for $z_u^*$, i.e. the estimated optimum value for $z_u$ is calculated using equations (8a) and (8b), together forming a linearly constrained quadratic problem with a solve unit 422 of flow data processing module 42. The value $z_u$ is an estimation for the optimum value. The actual value for the optimum will in practice deviate from this deviation due to the mutual influences of the various climate related fields. Upon convergence during subsequent iterations the estimated optimum approaches the actual optimum.

Schematically it is shown that the solve unit 422 has two mutually cooperating parts 4221 and 4222, wherein part 4221 searches for the value $z_u$ that minimizes the result of equation 7a, and wherein part 4222 restricts the possible solutions to the linear constraint set by equation 7b. Parts 4211 and 4212 of the preparation unit respectively compute the vector $b'_u$ and the matrix $A_u$ to be used by part 4222. In practice however, different implementations are possible and known to solve a linearly constrained quadratic problem.

The matrices Su, Qu and Ru, as well as the set point for ũ for the field u are provided by the user input module 48. The matrix Bu is provided by source mapping module 47 via bus 4B. The vector $b'_u(u^k, e_u^k)$ is calculated by preparation part 4221 from the flow field $U^k$ and the prevailing boundary conditions $e_u^k$ at point in time k. It suffices to perform these calculations at the onset of each series of iterations as the values for $u^k$ and $e_u^k$ are defined as constants during time step k. Part 4212 of preparation unit 421 calculates matrix A from the current values of the iterands u,v,w and P available on iterand bus 4I.

The optimum value $z_u^*$ found by solve unit 422 is provided to the update unit 423.

In step S3 the update unit 423 (having adder 4231 and storage element 4232) uses this value $z_u^*$ to update the value for $z_u$ (in storage element 4232) comprising the values for û and $q_u$ using:

$$z_u = (1-\alpha)z_u + \alpha z_u^* \tag{12}$$

Therein α is a relaxation parameter, which is for example selected in the range of 0 to 1, preferably in the range of 0.1 to 0.6, for example a value of about 0.4.

Similarly, flow data processing module 43 calculates the value for $z_v^*$ in step S4, using equations (9a) and (9b), and the value for $z_v$ comprising the values for v̂ and $q_v$ in step S5 using:

$$z_v = (1-\alpha)z_v + \alpha z_v^* \tag{13}$$

The units 431, 432 and 433 of flow data processing module 43 correspond to the units 421, 422 and 423 of flow data processing module 42.

Similarly, flow data processing module 44 calculates the value for $z_w^*$ in step S6 using equations (10a) and (10b), and the value for $z_w$ comprising the values for ŵ and $q_w$ in step S7 using:

$$z_w = (1-\alpha)z_w + \alpha z_w^* \tag{14}$$

The units 442 and 443 of flow data processing module 44 correspond to the units 422 and 423 of flow data processing module 42.

The unit 441 of flow data processing module 44 corresponds to the units 421 of flow data processing module 42 except for the fact that the part of preparation unit 441 that corresponds to the part 4112 of preparation unit 411 differs in that it also uses the current value of the iterand T for the calculation of vector $b'_w$. This is because a relatively strong relationship exists between flows in a vertical direction and the temperature distribution.

It is noted that in the embodiment shown the corrected values u,v,w of the iterands for the flow fields as determined by correction module 46 are used for the calculation of the matrices Au, Av, Aw. However, in an alternative embodiment, the uncorrected values û,v̂,ŵ may be used instead to calculate these matrices, as upon convergence, the corrected and uncorrected velocities are equal to each other. This may however slightly slow down convergence.

Next in step S8 temperature data processing module 41 calculates the value for $z_T^*$ using equations (7a) and (7b), and calculates the value for $z_T$ comprising the values for T and $q_T$ in step S9 using:

$$z_T = (1-\alpha)z_T + \alpha z_T^* \tag{15}$$

In the embodiment shown the solve unit 412 having parts 4121 and 4122 provides the solution $z_T^*$. Parts 4111 and 4112 of preparation unit 411 respectively calculate the vector $b'_T$ and matrix $A_T$ used by the solve unit 412. The update step is conducted by update unit 413 having an adder 4131 and a storage element 4132 for storing the value $z_T$.

These calculations substantially correspond to those described for the calculations relating to the flow fields u, v, w described above. Also the components of the temperature data processing module 41 as shown in FIG. 9 correspond to those of the flow data processing module 42 as shown in FIG. 10. Therein components of the temperature data processing module 41 that correspond to those of the flow data processing module 42 are referred by a reference number having a second digit that is 1 instead of 2.

Next in step S10 the value for P' is calculated as follows:

$$A_p(\hat{u},\hat{v},\hat{w})P' = b_p(\hat{u},\hat{v},\hat{w}) \tag{3}$$

Parts 4511 and 4512 of preparation unit respectively calculate the vector $b'_P$ and the matrix $A_P$.

In the present embodiment, the pressure P is not actively controlled. Accordingly, it suffices to solve the above-mentioned linear equation. Hence the solve unit 452 of the pressure data processing module only has a linear equation solving part 4522 as schematically illustrated in FIG. 11. Nevertheless in other embodiments the pressure P may be actively controlled. In that case the solve unit 452 of the pressure data processing module may also have an optimization part 4521 analogous to those used in the flow data processing modules and the temperature data processing modules.

And in step S11 the value for P is updated by update unit 453 (having adder 4331 and a storage element 4332 for the value P) as:

$$P = P + \alpha_p P' \tag{3a}$$

Therein $\alpha_P$ is a relaxation parameter, which is for example selected in the range of 0 to 1, preferably in the range of 0.1 to 0.6, for example a value of about 0.4.

The above-mentioned steps may also be performed according to another sequence, provided that the update step follows the step for calculating the *value for the estimated optimum.

The above-mentioned steps are followed by a correction step S12 involving the following calculation for updating the values for u,v and w:

$$(u,v,w) = f((\hat{u}, \hat{v}, \hat{w}), P') \quad (4)$$

This correction step is described in more detail in: Suhas V. Patankar, "Numerical Heat Transfer and Fluid Flow", ISBN 0-07-1980 048740-S, pp. 123-134.

In the embodiment of the data processor 4 shown in FIG. 8, this correction step is performed by the correction module 46.

In Step S13 it is verified whether the procedure has converged or not. Verification may take place, for example by comparing the differences between the updated values for the variables to be optimized and their previous values $z_\phi^{prev}$ with respective threshold values.

According to a more reliable test it is verified if the previously found values for the state vector $z_\phi^{prev}$ sufficiently match each of the updated linear constraints (5b).

I.e. it is verified if $[A_\phi - B_\phi] z_\phi^{prev} - b'_\phi(\Phi^k, e_\phi^k) < \eta_\phi$, wherein $\eta_\phi$ is a respective threshold value for each of the fields $\Phi$.

Figure 12A:
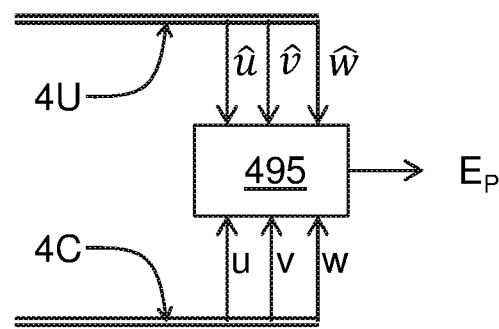

Additionally to verify the convergence of the pressure equation it is determined if the computational error of mass conservation is less than a predetermined threshold value $\eta_P$. In the embodiment shown this is verified by the circuit shown in FIG. 12A, which generates the signal Ep=True iff $$|u+\hat{u}|+|v-\hat{v}|+|w+\hat{w}| < \eta_P \quad (16)$$

Figure 12B:
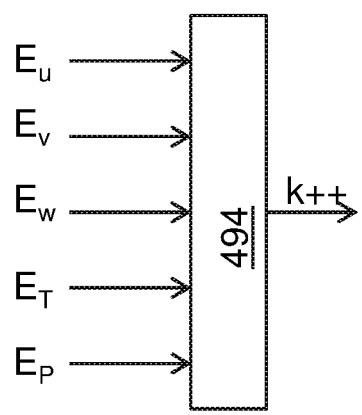

The procedure terminates if the verifications indicate for each of the equations that convergence has occurred, otherwise a following iteration is performed. To that end control element 494, as shown in more detail in FIG. 12B is arranged to issue a signal "k++" indicating global convergence if each of the converge indication signals $E_T$, Eu, Ev, Ew, Ep from the respective field data processing modules 41-45 indicates that convergence occurred for the corresponding monitored field. In response to the signal "k++", the iterand values present on bus 4C are transferred to results bus 4R. The source terms $q_\phi$ that are transferred as part of the transferred iterand values than can be used for control the actuators at point in time k.

Upon detection of global convergence the values of the iterands for the various augmented state vectors $z_u, z_v, z_w, z_T, z_P$ are transmitted from the iterand bus 4I via gate 493 as the results $z_u^k, z_v^k, z_w^k, z_T^k, z_P^k$ for the next point in time k on the results bus 4R. Therein the terms $z_\phi^k$ denote the augmented state vector $[\phi^k, q_\phi^k]$ The respective source terms $q_\phi^k$ of the results $z_u^k, z_v^k, z_w^k, z_T^k$ can be used to control the actuators $3a, \ldots, 3m$.

At the next point in time k, the source terms $q_T^k$ may for example control a respective driver that powers heating elements with a supply power that is proportional to the value of $q_T^k$. The source terms $q_u^k, q_v^k, q_w^k$ may control further respective drivers that drive respective fans at a speed proportional to the supplied value for those source terms. In case only stepwise controlled actuators are available, these may be switched on and off in accordance with a duty cycle corresponding to the values of the supplied source terms.

A further embodiment is now described which does not only take into account but also uses predicted input values for the boundary conditions, e.g. based on a weather forecast. In this way the data processor may better anticipate changes of said boundary conditions and/or with more modest energy requirements. This is in particular attractive for control of the temperature as the temperature field of an indoor space reacts relatively slowly to a change in the source settings unless high amounts of energy are allowed.

In this embodiment the augmented state vector $z_\phi^k$ for point in time k is replaced by a predictive augmented state vector, denoted as $$^{k'}z_\phi^k = \begin{bmatrix} \phi^{k+k'+1} \\ \vdots \\ \phi^{k+1} \\ q_\phi^{k+k'} \\ \vdots \\ q_\phi^k \end{bmatrix}$$

Therein the value k' denotes the number of time steps that is included in the prediction. For k'=0, the predictive augmented state vector reduces to the augmented state vector, i.e.: $^0z_\phi^k = z_\phi^k$ The optimization problem to be resolved is now generalized to:

$$^{k'}z_\phi^k = \operatorname{argmin}_{z_\phi} \left( \begin{bmatrix} ^{k'}S_\phi^{k+1} & ^{k'}O \end{bmatrix} ^{k'}z_\phi - ^{k'}\tilde{\Phi}^{k+1} \right)^T$$

$$^{k'}Q_\phi^k \left( \begin{bmatrix} ^{k'}S_\phi^{k+1} & ^{k'}O \end{bmatrix} ^{k'}z_\phi - ^{k'}\tilde{\Phi}^{k+1} \right) +$$

$$\left( \begin{bmatrix} ^{k'}O & ^{k'}I \end{bmatrix} ^{k'}z_\phi \right)^T {^{k'}R_\phi^k} \left( \begin{bmatrix} ^{k'}O & ^{k'}I \end{bmatrix} ^{k'}z_\phi \right)$$

Subject to $\begin{bmatrix} ^{k'}A_\phi^k & -^{k'}B_\phi^k \end{bmatrix} ^{k'}z_\phi - ^{k'}b''^k_\phi(^{k'}e_\phi^k) - \begin{bmatrix} B_{0,\phi}^k \Phi^k \\ 0 \\ \vdots \\ 0 \end{bmatrix} = 0$ The matrices $^{k'}S_\phi, ^{k'}O, ^{k'}I, ^{k'}Q_\phi, ^{k'}R_\phi$ used in the upper equation are obvious extensions to the matrices $S_\phi, O, I, Q_\phi, R_\phi$ used in equation 5a.

Furthermore the matrices $^{k'}A_\phi^k$ and $^{k'}B_\phi^k$ are defined respectively as:

$$^{k'}A_\phi^k = \begin{bmatrix} A_\phi^k & 0 & 0 & \cdots \\ -B_{0,\phi}^{k+1} & A_\phi^{k+1} & 0 & \cdots \\ \cdots & \cdots & \cdots & \cdots \\ & & -B_{0,\phi}^{k'} & A_\phi^{k+k'} \end{bmatrix}$$

$$^{k'}B_\phi^k = \begin{bmatrix} B_\phi^k & 0 & \cdots & \cdots \\ 0 & B_\phi^{k+1} & 0 & \cdots \\ \cdots & \cdots & \cdots & \cdots \\ 0 & \cdots & \cdots & B_\phi^{k+k'} \end{bmatrix}$$

Therein:

$$^{k'}b_\phi(^{k'}\Phi^k, ^{k'}q_\phi^k, ^{k'}e_\phi^k) =$$

$$^{k'}B_{0,\phi}^k \Phi^k + ^{k'}B_\phi^k {^{k'}q_\phi^k} + ^{k'}B_{e,\phi}^k {^{k'}e_\phi^k} == ^{k'}B_\phi^k {^{k'}q_\phi^k} + ^{k'}b_\phi'^k(^{k'}\Phi^k, ^{k'}e_\phi^k) =$$

$$^{k'}B_{0,\phi}^k {^{k'}\Phi^k} + ^{k'}B_\phi^k {^{k'}q_\phi^k} + ^{k'}b_\phi''^k(^{k'}e_\phi^k)$$

-continued

Hence:

$$_{k'}B_{e,\Phi}^{k} = \begin{bmatrix} B_{e,\Phi}^{k} & 0 & \cdots & \cdots \\ 0 & B_{e,\Phi}^{k+1} & 0 & 0 \\ \cdots & \cdots & \cdots & \cdots \\ 0 & \cdots & \cdots & B_{e,\Phi}^{k+k'} \end{bmatrix}$$

And $$_{k'}e_{\Phi}^{k} = \begin{bmatrix} e_{\Phi}^{k} \\ e_{\Phi}^{k+1} \\ \vdots \\ e_{\Phi}^{k+k'} \end{bmatrix}$$

The monitoring system as presented with reference to FIGS. 1-3 and the monitoring method as presented with reference to FIGS. 4-6, have proven to be suitable for small to moderate size implementations. Although this apparatus and method also are applicable for larger scale implementations, it has been found that the computational complexity grows relatively fast with the size of the system in which it is implemented.

According to a further improved embodiment the temperature field to be compared with the temperature measurement data is estimated with a constrained quadratic equation. This secures that the estimated temperature field exactly matches the constraints set by the physical behavior of the fluid in the indoor space.

Figure 14:
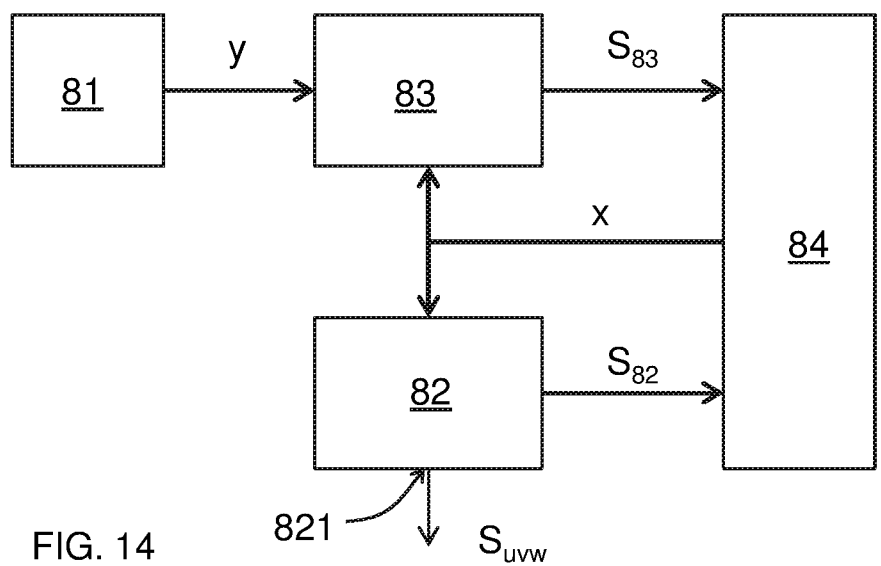
FIG. 14 shows part of an alternative data processor for use in a monitoring system according to the first aspect of the invention.

An example of the improved embodiment is illustrated with reference to FIG. 14. As in the embodiment of FIG. 2, the monitoring system comprises an input unit 81, a simulation unit 82, a comparison unit 83 and a state correction unit 84. Typically, the input unit 81 comprises a plurality of temperature sensors to obtain temperature measurement data indicative for a temperature field in the indoor space. However, the input unit 81 may comprise additional sensors for measuring other fields, for example a pressure field. The simulation unit 82 is provided to simulate the fluid in the indoor space according to an indoor climate model to predict a state of the fluid including at least a temperature field and a flow field for the fluid in the indoor space. The simulation unit 82 has an output 821 to provide a signal $S_{uvw}$ indicative for the flow field. The simulation unit 82 may provide additional output data, for example output data indicative for the pressure field. The simulation unit 82 issues an output signal $S_{82}$ that is indicative for the extent to which a state x complies with the model of the fluid. The comparison unit 83 is provided to compare the predicted temperature field Tp, which is a component of the statevector x with the temperature measurement data y. The comparison unit 83 issues an output signal $S_{83}$ that indicates to which extent the predicted temperature field complies with the temperature measurement data.

The state correction unit 84 is provided to correct the predicted state x of the fluid based on a comparison result $S_{83}$ of the comparison unit 83 and further guided by the output signal $S_{82}$ provided by the simulation unit 82.

More in particular, the embodiment shown in FIG. 14 operates as follows.

Comparison unit 83 compares measured temperature data y for positions in the indoor space with predicted temperature data $T_p$ for respective cells corresponding to those positions in a model for the indoor space and generates an error signal $S_{83}$. The predicted temperature data is selected from the statevector x, by selection matrix C.

Figure 15:
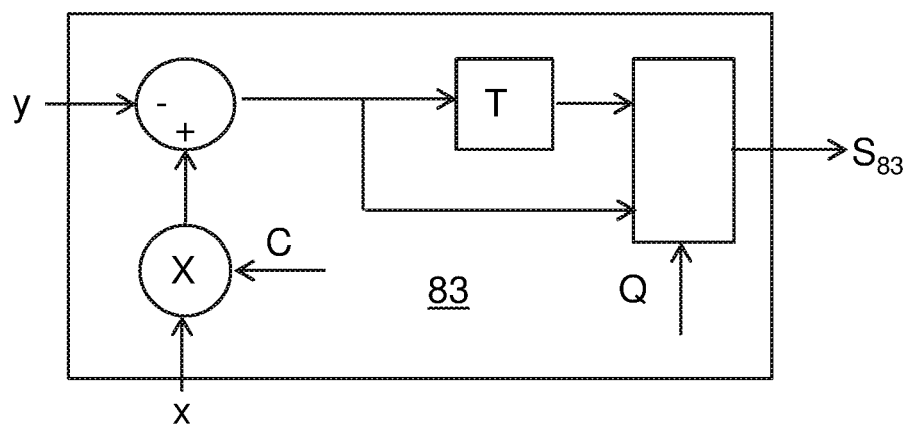
FIG. 15 shows a module of the part as shown in FIG. 14 in more detail.

An exemplary comparison unit 83 is shown in FIG. 15.

The error signal $S_{83}$ may for example indicate a value A that is generated by the comparison unit 83 for example as:

$$\Delta = (Cx-y)^{T}Q(Cx-y)$$

Therein:

$y = (y_T^T, y_u^T, y_v^T, y_w^T, y_p^T)^T$, T denotes transpose, and $C = (C_T, C_u, C_v, C_w, C_p)$, with the indices T,u,v,w,p respectively indicating the temperature field T, the flow fields u,v,w and the pressure field P.

Therein C are the state space matrices for each of the interrelated fields, here the temperature field T, the flow fields u,v,w and the pressure field P respectively. The symbol y represents the vectors of measurements for these field. The weights of Q (which is diagonal), can be chosen based on known measurement noise characteristics. Higher values indicate more confidence in the corresponding measurement.

State correction unit 84 updates the augmented state vector x to an optimal value x* as:

$$x^{*} = \arg\min(Cx-y)^{T}Q(Cx-y),$$

State correction unit 84 is coupled to simulation unit 82 in order to cause the updating process to proceed in accordance with the physical model available for the fluid in the indoor space. To that end it is verified that the following equality is met:

$$Ax = b(X^{*}, e^{k}, q^{k})$$

This equality represents a model of the indoor climate, in that it models the changes in the internal climate as a result of the previous state of the internal climate x, the source terms q and other boundary conditions e. The signal $S_{82}$ indicates to what extent the equality is met, for example as:

$$\Delta_{M} = |Ax - b(x^{k}, e^{k}, q^{k})|^{2}$$

Also another measure, for example an L1 measure or an $L_{\infty}$ measure may be used to as an indicator.

The simulation unit 82 may be implemented in various ways. According to one approach the simulation is performed separately for each field, e.g. for the flow fields, the temperature field and the pressure field.

Figure 16:
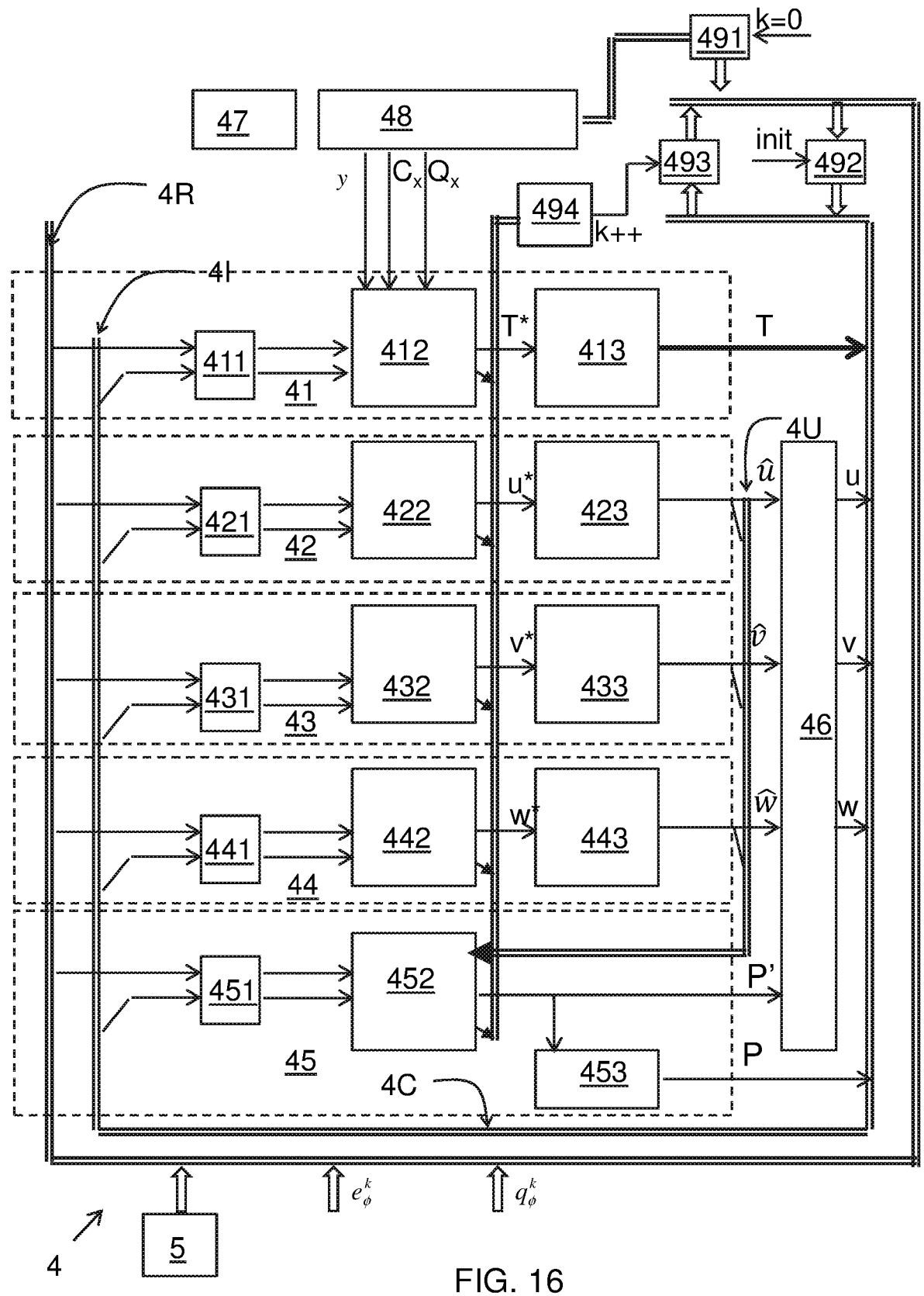
FIG. 16 shows the alternative data processor for use in a monitoring system including the part shown in FIG. 14.

This is schematically illustrated in FIG. 16. I.e. the data processor 4 comprises a temperature data processing module 41, a first, a second and a third flow data processing module 42, 43, 44 and a pressure data processing module 45. Temperature solve unit 412 calculates the optimum T* for the temperature field T, using the currently available temperature data y, and other input data based on a matrix $A_T$, and the vector $b_T$ calculated by unit 411.

Figure 17:
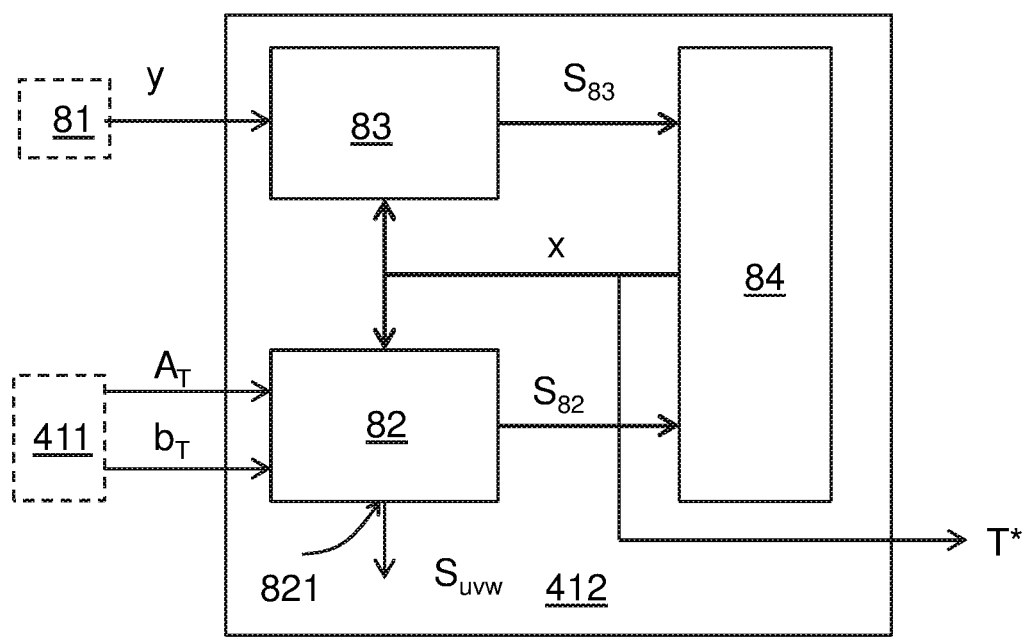
FIG. 17 shows an additional detail of the alternative data processor of FIG. 16.

This is schematically indicated in FIG. 17. The calculated optimum T* is used to update a temperature by update unit 413.

Similarly, the other data processing module 42, 43, 44 and 45 each calculate an optimum value u*, v*, w*, and P'. for the fields u, v, w, P. Upon convergence, a new state $x^k$ is established that would explain the measured data y.

According to an improved approach the simulation unit 82 may perform the simulation by evaluating the equations in a mutually coupled fashion, as is described above with reference to FIGS. 18 and 19.

As noted, in the embodiment discussed above with reference to FIG. 16, 17, separate modules are provided for each of the fields involved in the optimization. I.e. the data processor 4 comprises a temperature data processing module 41, a first, a second and a third flow data processing module 42, 43, 44 and a pressure data processing module 45. Mutual effects between the various fields are taken into account by the respective preparation units which receive the input data from the other fields. For example, the transition matrix $A_T$ that is used by the solve unit 412 is calculated by part 4112 of the preparation unit 411 for that solve unit 412, takes into account the values of the iterands for the motion fields.

Figure 18:
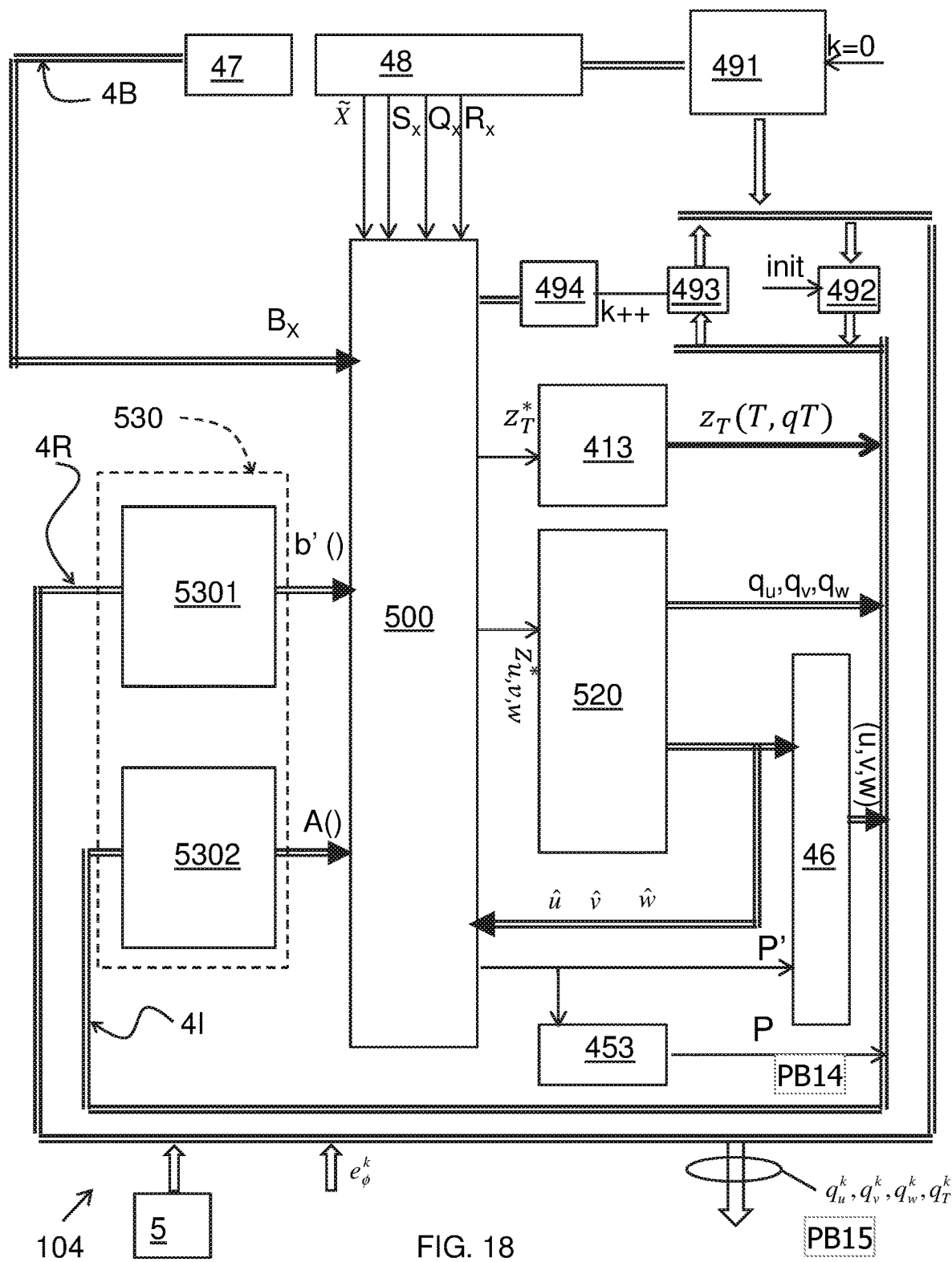
FIG. 18 shows a still further alternative data processor for use in a monitoring system.

A data processor 104, being an alternative embodiment of the data processor 4 is shown in more detail in FIG. 18. Parts therein corresponding to those in FIG. 8 have the same reference number.

In this embodiment, the data processor 104 comprises a single data processing module for each of the fields (for example the temperature field, the motion fields and the pressure field) involved.

Hence, in the data processor as shown in FIG. 18 performs the following optimization.

$$x^* = \arg\min(Cx-y)^T Q(Cx-y) \quad (17a)$$

Subject to $$Ax - b(x^k, e^k, q^k = 0) \quad (17b)$$

Wherein:

$$x = (T^T, u^T, v^T, w^T, P^T)^T$$

$$q = (q_T^T, q_u^T, q_v^T, q_w^T, q_P^T)$$

$$e = (e_T^T, e_u^T, e_v^T, e_w^T, e_P^T)$$

$$z = (x^T, q^T)^T$$

For completeness sake it is noted that the notation is used to indicate a single column vector, subsequently including the elements of each of the vectors in the order specified between the brackets.

And further $$Q = \begin{pmatrix} Q_T & 0 & 0 & 0 & 0 \\ 0 & Q_u & 0 & 0 & 0 \\ 0 & 0 & Q_v & 0 & 0 \\ 0 & 0 & 0 & Q_w & 0 \\ 0 & 0 & 0 & 0 & Q_P \end{pmatrix}$$

$$C = (C_T \quad C_u \quad C_v \quad C_w \quad C_P)$$

$$A = \begin{pmatrix} A_T(u,v,w) & 0 & 0 & 0 & 0 \\ 0 & A'_u(u,v,w) & 0 & 0 & A_u^P \\ 0 & 0 & A'_v(u,v,w) & 0 & A_v^P \\ A_w^T & 0 & 0 & A'_w(u,v,w) & A_w^P \\ 0 & A_u^c & A_v^c & A_w^c & 0 \end{pmatrix}$$

Moreover, as a further improvement, the state x to be optimized may be extended to an augmented state z. The augmented state z not only includes the data for the various fields, but additionally includes the data for the external factors that affect these fields, such as exogenous terms and source terms. In other words, the augmented state variable to be optimized includes all fields to be optimized as well as all source terms for the fields to be optimized.

In this embodiment the calculation of the source term for each of the actuators includes its direct effect also on related fields in addition the field(s) which are specifically controlled by the actuator. For example a fan, intended to control the motion fields also affects the temperature distribution.

Similarly to what is indicated above for the energy equation (1), the equation 17b can be rewritten as (arguments for the components of matrix A and for the components of vector b not shown):

$$\begin{pmatrix} A_{11} & \cdots & A_{1n} \\ \cdots & \cdots & \cdots \\ A_{n1} & \cdots & A_{nn} \end{pmatrix} \begin{pmatrix} T_1 \\ \vdots \\ T_n \end{pmatrix} = \begin{pmatrix} b_1 \\ \vdots \\ b_n \end{pmatrix}$$

Therein the vector $b_x(x^k, q_x^k, e_x^k)$ is considered a linear function of its arguments that can be written as follows:

$$b_x(x^k, q_x^k, e_x^k) = B_q q_x^k + B_0 x^k + B_e e_x^k = B_q q_x^k + b'_x(x^k, e_x^k)$$

Wherein:

$$B_q = \begin{pmatrix} B_q^T & 0 & 0 & 0 & 0 \\ 0 & B_q^u & 0 & 0 & 0 \\ 0 & 0 & B_q^v & 0 & 0 \\ 0 & 0 & 0 & B_q^w & 0 \\ 0 & 0 & 0 & 0 & B_q^P \end{pmatrix},$$

$$B_0 = \begin{pmatrix} B_0^T & 0 & 0 & 0 & 0 \\ 0 & B_0^u & 0 & 0 & 0 \\ 0 & 0 & B_0^v & 0 & 0 \\ 0 & 0 & 0 & B_0^w & 0 \\ 0 & 0 & 0 & 0 & B_0^P \end{pmatrix}, \text{ and}$$

$$B_e = \begin{pmatrix} B_e^T & 0 & 0 & 0 & 0 \\ 0 & B_e^u & 0 & 0 & 0 \\ 0 & 0 & B_e^v & 0 & 0 \\ 0 & 0 & 0 & B_e^w & 0 \\ 0 & 0 & 0 & 0 & B_e^P \end{pmatrix}$$

Contrary to the previous embodiments the pressure correction equation is not solved. Instead, the continuity equation is directly solved. This is given by the matrices Ac. Flow speeds are weighted by cell areas and all incoming flows per cell are added together. These should all be 0, or, in case of a (controllable) mass source in a cell, a certain value mapped through $B_q^c$ or $B_q^e$. In practice, these last 2 matrices are zero.

The momentum equations are rewritten, so that a mapping matrix for the pressure (and in the z-momentum equation also a mapping for temperature) are extracted.

The matrix A is not of full rank (zeros on the lower right part of the diagonal). It is noted that only the pressure differences rather than the absolute pressure is defined. Typically this information is sufficient for the purpose of calculating the required actuator settings or for determining the required capacity of actuators in a climate control system. Should it nevertheless be desired to calculate the absolute pressure this can be realized by assigning a value to one of the pressures to 'ground' the system. Alternatively, the lower right diagonal (now zeros), may be replaced with an identity matrix with a very small scaling.

Figure 19:
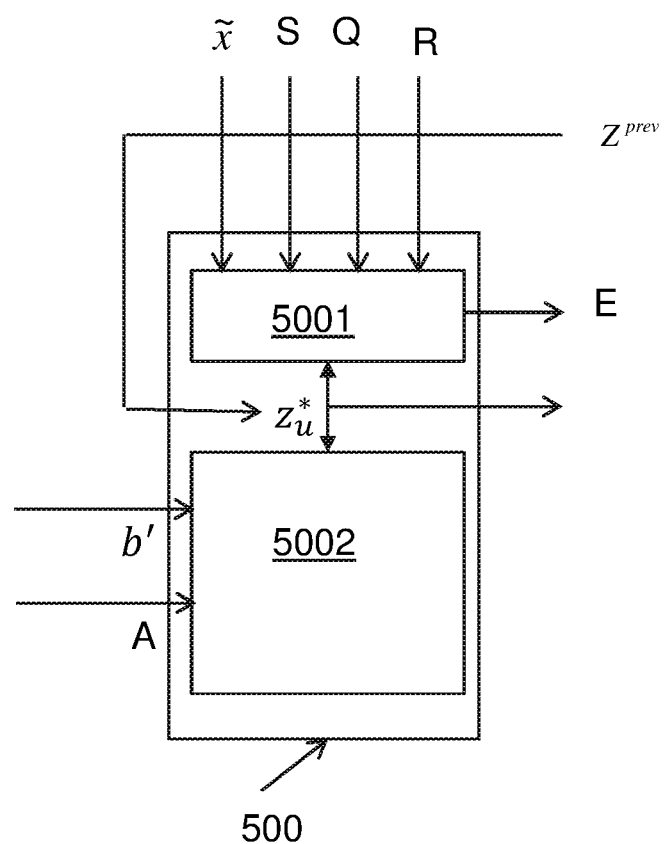
FIG. 19 shows a part of the alternative data processor of FIG. 18.

In the data processor 104 of FIG. 18, the solve unit 500, shown in more detail in FIG. 19 calculates the optimized value z* in accordance with equations 17a, 17b. As in FIG. 9,10 for example the solve unit 500 has two mutually cooperating parts 5001 and 5002, wherein part 5001 searches for the value z* that minimizes the result of equation 17a, and wherein part 5002 restricts the possible solutions to the linear constraint set by equation 17b. It is noted that other embodiments are possible. A single preparation unit 530 that includes a first part 5301 for calculating the vector bu and a second part 5302 for calculating the matrix A to be used by the solve unit 500. Update unit 520 includes the update units 423, 433 and 443 as specified for FIG. 8.

It is noted that instead of providing separate modules for each field to be optimized or a single module for all fields, alternative configurations are possible too. For example a shared module may be provided for some of the fields to be controlled, whereas other fields may each have a dedicated module.

Similarly, the present state of a field may be estimated using measurement data obtained from another field using a model including at least these fields, for example to estimate the flow field on the basis of measurements obtained from the temperature field.

This set of equations can further be rewritten as follows:

$$z^* = \mathrm{argmin}\left(\begin{pmatrix} C & 0 & 0 \\ 0 & B_q & 0 \\ 0 & 0 & B_e \end{pmatrix} z - \begin{pmatrix} y \\ \tilde{q} \\ \tilde{e} \end{pmatrix}\right)^T Q \left(\begin{pmatrix} C & 0 & 0 \\ 0 & B_q & 0 \\ 0 & 0 & B_e \end{pmatrix} z - \begin{pmatrix} y \\ \tilde{q} \\ \tilde{e} \end{pmatrix}\right)$$

Subject to:

$(A-B_q-B_e)x=B_0 x^k$

With:

$z=(x^T q^T e^T)$ $b=B_0 x^k + B_q q^k + B_e e^k$

Wherein the matrices A, $B_q, B_e, B_0$ are as specified above. Using the fact that right hand side term b can be written as a combination of linear mappings of previous climate (x), source terms (q) and other boundary conditions (e), these can also be brought into the augmented state vector. This enables an estimation of their true values, based on measurements y that may be indirect. For example, a measurement result for a temperature in the middle of the indoor space provides information on the amount of wind that enters through a window. If the minimum and maximum of a source term are known, but the actual value is not, these boundaries are easily included in the optimization. If one knows that a source term should be close to a certain number, this can be added in the objective function. For instance, an exogenous term could be the heat emitted by a human in the indoor space. This is known to be typically 100 Watts, but depending on the specific person and his/her activity, it could range between 75 and 125 watts. Then, the following equation can be solved:

$$z^* = \mathrm{argmin}\left(\begin{pmatrix} C & 0 \\ 0 & B_e \end{pmatrix} z - \begin{pmatrix} y \\ 100 \end{pmatrix}\right)^T \begin{pmatrix} Q_y & 0 \\ 0 & Q_e \end{pmatrix} \left(\begin{pmatrix} C & 0 \\ 0 & B_e \end{pmatrix} z - \begin{pmatrix} y \\ 100 \end{pmatrix}\right)$$

Subject to:

$(A-B_e)z=B_0 x^k + B_q q^k$ $75 \leq (0\ 1)z \leq 125$

With $z=(x_T e_T)^T$

Weights in Qe can be determined based on the confidence in the estimation of the value 100 for the power as an exogenous term contributed by the person in the room. Similarly the weights in Qy reflect the confidence in the sensor readings used. As the simulation unit 8201 performs the simulation by resolving the equations for the various fields in a mutually coupled fashion, changes in measurement results for one field can be reliably used for estimating a state of another field.

It will be appreciated that the apparatus for monitoring a state of a fluid in an indoor space, discussed with reference to FIG. 18 in summary operates as follows.

Temperature measurement data ae obtained that are indicative for a temperature field in the indoor space.

The fluid in the indoor space is simulated according to an indoor climate model. The indoor climate model predicts a state of the fluid including at least a temperature field and a flow field for the fluid.

The temperature field is retrieved from the current state as determined by the simulation. This retrieved temperature field represents the predicted temperature field.

An error measure is determined, which is indicative for a difference between the predicted temperature field and the temperature measurement data.

A corrected state of (the fluid in) the indoor space is calculated by changing the predicted state so as to minimize the error measure, while verifying by the simulating step that the corrected state complies with the indoor climate model.

As will be apparent to a person skilled in the art, the elements listed in the system claims are meant to include any hardware (such as separate or integrated circuits or electronic elements) or software (such as programs or parts of programs) which reproduce in operation or are designed to reproduce a specified function, be it solely or in conjunction with other functions, be it in isolation or in co-operation with other elements. The invention can be implemented by means of hardware comprising several distinct elements, and by means of a suitably programmed computer. In the apparatus claim enumerating several means, several of these means can be embodied by one and the same item of hardware. 'Computer program product' is to be understood to mean any software product stored on a computer-readable medium, such as a floppy disk, downloadable via a network, such as the Internet, or marketable in any other manner.

In the claims the word "comprising" does not exclude other elements or steps, and the indefinite article "a" or "an" does not exclude a plurality. A single component or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. A climate control system for controlling a climate in an indoor space, the climate control system including a monitoring system and a data processor, the monitoring system comprising:

an input unit comprising a plurality of temperature sensors to obtain temperature measurement data ($y_{1T}^k$, $y_{2T}^k, \ldots, y_{mT}^k$) indicative for a temperature field in said indoor space, a simulation unit to simulate fluid in said indoor space according to an indoor climate model, and to provide a predicted state of said fluid including at least a predicted temperature field (Tp) and a predicted flow field for the fluid in said indoor space, a comparison unit to compare the predicted temperature field with the temperature measurement data, and a state correction unit to provide a corrected state of the fluid based on a comparison result of said comparison unit, wherein the data processor receives, as an input, the predicted state of said fluid and providing, as an output, one or more control signals indicative of the corrected state of the fluid, and wherein the one or more control signals are provided to one or more actuators configured to change at least one variable of the climate in the indoor space, said one or more actuators selected from a heater, an air conditioner, a ventilator, a pump, a humidifier, or a dryer.

2. The climate control system according to claim 1, wherein the predicted temperature field (Tp) is determined by the simulation unit, based on the data indicative for the temperature field that is retrieved by the simulation unit, and wherein the state correction unit is coupled to the simulation unit in order to minimize an error measure (Δ) as determined by the comparison unit by changing the state (x,z) in accordance with the indoor climate model.

3. The climate control system according to claim 1, wherein the simulation unit comprises a state estimation unit to execute an iteration $^{(u,v,w,P)}$, and to provide at least the predicted flow field and a predicted pressure field based at least on a previous known state of the fluid ($u^{k-1}, v^{k-1}, w^{k-1}, P^{k-1}, T^{k-1}$), according to said indoor climate model, a matrix update module to update a first and a second state evolution matrix (ASS,BSS) using a model for the temperature field defined by $$A_T(u,v,w)T = B_e e_T^{k-1} + B_q q_T^{k-1} + B_0 T^{k-1}$$

and a Kalman prediction module, to provide the predicted temperature field (Tp) using said first and second state evolution matrix.

4. The climate control system according to claim 3, wherein the comparison unit comprises a Kalman evaluation module to update the predicted temperature field (Tp) to an updated temperature field (T*) by comparing the temperature measurement data ($Y_T^k$) with said predicted temperature field (Tp), wherein said state correction unit comprises a temperature iteration module for generating consecutive iterated values for the predicted temperature (Tp) field based on said comparison result, the monitoring system further comprising a state renew unit, the monitoring system including a controller configured to verify if a difference (ΔT) between said consecutive iterated values for the predicted temperature field (Tp) predicted by the Kalman prediction module complies with a predetermined requirement, and further configured to cause said simulation unit to perform a next iteration until said difference complies with the predetermined requirement and to cause the state renew unit to update the predicted state of the fluid if said difference complies with the predetermined requirement.

5. The climate control system according to claim 4, wherein said state estimation unit comprises a flow estimation unit to provide an estimation ($\hat{u},\hat{v},\hat{w}$) of a motion field (u,v,w) in respective orthogonal directions (x,y,z) in by solving u*,v*, w* from $$A_u(u,v,w,P)u^* = b_u(u^{k-1}, q_u^{k-1}, e_u^{k-1})$$

$$A_v(u,v,w,P)v^* = b_v(v^{k-1}, q_v^{k-1}, e_v^{k-1})$$

$$A_w(u,v,w,P)w^* = b_w(T, w^{k-1}, q_w^{k-1}, e_w^{k-1}),$$

and by calculating weighted sums $$\hat{u} = (1-\alpha)u + \alpha u^*$$

$$\hat{v} = (1-\alpha)v + \alpha v^*$$

$$\hat{w} = (1-\alpha)w + \alpha w^*,$$

wherein u,v,w are corrected values corresponding to previous iterated values for said motion field, and wherein α is a weighting factor in a range between 0 and 1, a pressure data processing module to calculate a pressure correction (P') according to $$A_p(\hat{u},\hat{v},\hat{w})P' = b_p(\hat{u},\hat{v},\hat{w})$$

and to update the pressure field (P) based on the pressure correction (P'), $$P = P + \alpha_p P'$$

a correction module to update the motion field (u,v,w) using said pressure correction (P')

$$(u,v,w) = f((\hat{u},\hat{v},\hat{w}),P')$$

wherein said Kalman prediction module estimates the predicted temperature field (Tp) using said first and second state evolution matrix, according to:

$$T_p = A_{SS}T^{k-1} + B_{SS}(q_T^{k-1}e_T^{k-1})$$

$$V_p = A_{SS}V_a^{k-1}A_{SS}^T + E_Q$$

wherein said Kalman evaluation module updates the predicted temperature field (Tp) to the updated temperature field (T*) by comparing the temperature measurement data ($y_T^k$) with respective predicted values $C_{SS}T_p$ based on said predicted temperature field (Tp) according to the following set of equations wherein said Kalman evaluation module updates the predicted temperature field (Tp) to the updated temperature field (T*) by comparing the temperature measurement data ($Y_T^k$) with respective predicted values $C_{SS}T_p$ base on said predicted temperature filed (Tp) according to the following set of equations $$K = V_p C_{SS}^T (C_{SS}V_p C_{SS}^T + E_R)^{-1}$$

$$T^* = T_p + K(y_T^k - C_{SS}T_p).$$

6. The monitoring system according to claim 4, wherein said matrix update module updates said state evolution matrix $A_{SS}$ according to:

$$A_{SS} = A_p^{-1}(B_0 + A_p - A_T),$$

and approximates said state evolution matrix $B_{SS}$ as $$B_{SS} = A_T^{-1}[B_q B_e],$$

wherein $A_p$ is a diagonal matrix of which the diagonal elements are equal to those of the matrix $A_T$.

7. The climate control system according to claim 1, comprising a mapping matrix to estimate the temperature field of the fluid from the temperature measurement data ($y_T^k$).

8. The climate control system according to claim 1, comprising a mapping matrix to map the predicted temperature field to a vector of temperature values to be compared with the temperature measurement data ($y_T^k$).

9. The climate control system according to claim 8, wherein said mapping matrix dynamically maps the predicted temperature field.

10. The climate control system of claim 1, wherein said one or more actuators are driven by respective drivers, said drivers being powered according to respective source terms $q_\Phi$, determined by said data processor, for a point in time k, and said one or more actuators are controlled at respective setpoints specified by vector $\tilde{\Phi}^{k+1}$, determined by said data processor, for a subsequent point in time k+1.

11. The climate control system according to claim 1, wherein said one or more actuators is a plurality of actuators.

12. The climate control system according to claim 11, wherein said data processor jointly resolves a set of coupled optimization problems of the following form $$z_\Phi^k = \arg\min_{z_\Phi}([S_\Phi^{k+1}O]z_\Phi - \tilde{\Phi}^{k+1})^T Q_\Phi^k ([S_\Phi^{k+1}O]z_\Phi - \tilde{\Phi}^{k+1}) + ([OI]z_\Phi)^T R_\Phi^k ([OI]z_\Phi) \quad (5a)$$

subject to $$[A_\Phi^k - B_\Phi^k]z_\Phi - b'^k_\Phi(\Phi^k, e_\Phi^k) = 0 \quad (5b)$$

wherein:

$$z_\Phi = \begin{bmatrix} \Phi \\ q_\Phi \end{bmatrix}$$

is an augmented state-vector comprising a vector $\Phi$ specifying the spatial distribution (also denoted as field) of a climate related variable with respect to a plurality of spatial cells, and a source term $q_\Phi$ to be resolved, and wherein $$\tilde{z}_\Phi^k = \begin{bmatrix} \Phi^{k+1} \\ q_\Phi^k \end{bmatrix}$$

is the solution found for point in time k, $\tilde{\Phi}^{k+1}$ being a vector specifying a setpoint specified for said climate related variable at point in time k+1 for at least a part of said plurality of cells, $e_\Phi^k$ are boundary conditions relevant for said climate related variable at point in time k, S is a selection matrix, selecting cells for said field having a setpoint, O is the zero matrix, I is the identity matrix and Q and R are weighting matrices for tracking and energy consumption, and
- wherein $A_\Phi$ is a matrix that defines the development of vector $\Phi$ as a function of one or more other vectors of climate related variables,
- wherein $B_\Phi$ is a matrix that maps the source terms for field $\Phi$ to the cell field values affected by those source terms, and wherein the data processor provides the control signals in accordance with the source term $q_\Phi$.

13. Method for monitoring a state of a fluid in an indoor space, including a state of a flow field for said fluid, the method comprising:
obtaining temperature measurement data indicative for a temperature field in said indoor space;
simulating the fluid in said indoor space according to an indoor climate model to predict a state of said fluid including at least a temperature field (Tp) and a predicted flow field for the fluid in said indoor space,
while calculating a corrected state ($T^k;u^k;v^k,w^k;P^k$) of said indoor space on the basis of a comparison of the predicted temperature field (Tp) and the temperature measurement data ($y_T^k$), and
providing one or more control signals indicative of the corrected state of the fluid, wherein the one or more control signals are provided to one or more actuators configured to change at least one variable of the climate in the indoor space, said one or more actuators selected from a heater, an air conditioner, a ventilator, a pump, a humidifier, or a dryer.

14. The method according to claim 13, comprising
determining the predicted temperature field (Tp) by said simulating, based on the data indicative for the temperature field,
determining an error measure ($\Delta$), which is indicative for a difference between said predicted temperature field (Tp) and said temperature measurement data,
calculating the corrected state of said indoor space by changing the predicted state so as to minimize the error measure ($\Delta$), while verifying by said simulating that said corrected state complies with the indoor climate model.

15. The method according to claim 13, wherein said simulating comprises
executing an iteration (u,v,w,P) to provide at least the predicted flow field and a predicted pressure field based at least on a previous known state of the fluid ($u^{k-1}$, $v^{k-1}, w^{k-1}, P^{k-1}, T^{k-1}$), according to said indoor climate model;
updating a first and a second state evolution matrix ($A_{ss}, B_{ss}$) using a model for the temperature field defined by $$A_T(u,v,w)T = B_e e_T^{k-1} + B_q q_T^{k-1} + B_0 T^{k-1};$$

applying a Kalman prediction step to provide the predicted temperature field (Tp) using said first and second state evolution matrix.

16. The method according to claim 15,
wherein said comparison comprises
applying a Kalman evaluation step to update the predicted temperature field ($T_p$) to an updated temperature field ($T^*$) by comparing the temperature measurement data ($y_T^k$) with said predicted temperature field (Tp),
generating consecutive iterated values for the predicted temperature field (Tp) based on said comparison,
wherein said simulating while calculating a corrected state is followed by verifying if a difference ($\Delta T$) between said consecutive iterated values for the predicted temperature field (Tp) predicted with the Kalman prediction step complies with a predetermined requirement,
wherein said simulating while calculating is repeated if it is detected that said difference does not comply with the predetermined requirement and wherein the predicted state of the fluid is updated if said difference complies with the predetermined requirement.

17. The method according to claim 16, wherein said iteration of said estimation comprises
providing an estimation ($\hat{u}, \hat{v}, \hat{w}$) of a flow (u,v,w) in respective mutually orthogonal directions (x,y,z) by solving intermediate values (u*,v*, w*) from $$A_u(u,v,w,P)u^* = b_u(u^{k-1}, q_u^{k-1}, e_u^{k-1})$$

$$A_v(u,v,w,P)v^* = b_v(v^{k-1}, q_v^{k-1}, e_v^{k-1})$$

$$A_w(u,v,w,P)w^* = b_w(T, w^{k-1}, q_w^{k-1}, e_w^{k-1}),$$

and by calculating weighted sums $$\hat{u} = (1-\alpha)u + \alpha u^*$$

$$\hat{v} = (1-\alpha)v + \alpha v^*$$

$$\hat{w} = (1-\alpha)w + \alpha w^*,$$

wherein u,v,w are corrected values corresponding to previous iterated values for said flow, and wherein α is a weighting factor in a range between 0 and 1,
calculating a pressure correction (P') according to $$A_p(\hat{u}, \hat{v}, \hat{w})P' = b_p(\hat{u}, \hat{v}, \hat{w})$$

and updating the pressure field (P) based on the pressure correction (P'), $$P = P + \alpha_p P'$$

updating the flow field (u,v,w) using said pressure correction (P')

$$(u,v,w) = f((\hat{u}, \hat{v}, \hat{w}), P')$$

said Kalman prediction step using said first and second state evolution matrix, according to:

$$T_p = A_{SS}T^{k-1} + B_{SS}(q_T^{k-1} e_T^{k-1})$$

$$V_p = A_{SS}V_a^{k-1}A_{SS}^T + E_Q$$

said Kalman evaluation step updating the predicted temperature field ($T_p$) to the updated temperature field (T*) by comparing the temperature measurement data ($y_T^k$) with respective predicted values $C_{SS}T_p$ based on said predicted temperature field (Tp) according to the following set of equations $$K = V_p C_{SS}^T (C_{SS} V_p C_{SS}^T + E_R)^{-1}$$

$$T^* = T_p + K(y_T^k - C_{SS}T_p).$$

18. The method according to claim 17, wherein said state evolution matrix $A_{SS}$ is approximated according to:

$$A_{SS} = A_p^{-1}(B_0 + A_p - A_T),$$

and wherein said state evolution matrix $B_{SS}$ is approximated according to $$B_{SS} = A_T^{-1}[B_q B_e],$$

wherein $A_p$ is a diagonal matrix of which the diagonal elements are equal to those of the matrix $A_T$.

19. The method of claim 13, wherein said one or more actuators are driven by respective drivers, said drivers being powered according to respective source terms $q_\Phi$, determined by said steps of simulating while calculating the corrected state, for a point in time k, and said one or more actuators are controlled at respective setpoints specified by vector $\tilde{\Phi}^{k+1}$, determined by said steps of simulating while calculating the corrected state, for a subsequent point in time k+1.

* * * * *